US009391268B2

(12) United States Patent
Sasago

(10) Patent No.: US 9,391,268 B2
(45) Date of Patent: Jul. 12, 2016

(54) SEMICONDUCTOR STORAGE DEVICE

(75) Inventor: Yoshitaka Sasago, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 20 days.

(21) Appl. No.: 14/405,721

(22) PCT Filed: Jun. 4, 2012

(86) PCT No.: PCT/JP2012/064368
§ 371 (c)(1),
(2), (4) Date: Dec. 4, 2014

(87) PCT Pub. No.: WO2013/183101
PCT Pub. Date: Dec. 12, 2013

(65) Prior Publication Data
US 2015/0155479 A1    Jun. 4, 2015

(51) Int. Cl.
H01L 27/24   (2006.01)
H01L 45/00   (2006.01)
G11C 13/00   (2006.01)

(52) U.S. Cl.
CPC ............ *H01L 45/06* (2013.01); *G11C 13/0004* (2013.01); *G11C 13/004* (2013.01); *H01L 27/2454* (2013.01); *H01L 27/2481* (2013.01); *H01L 45/122* (2013.01); *G11C 13/0069* (2013.01); *G11C 2213/71* (2013.01); *G11C 2213/75* (2013.01); *G11C 2213/78* (2013.01); *G11C 2213/79* (2013.01); *H01L 45/1233* (2013.01); *H01L 45/144* (2013.01)

(58) Field of Classification Search
CPC . H01L 45/06; H01L 45/1233; H01L 27/2454; H01L 27/2481; H01L 27/249
See application file for complete search history.

(56) References Cited

U.S. PATENT DOCUMENTS

| 2007/0158736 | A1 | 7/2007 | Arai et al. |
| 2008/0149913 | A1 | 6/2008 | Tanaka et al. |
| 2010/0182828 | A1 | 7/2010 | Shima et al. |
| 2012/0087178 | A1 | 4/2012 | Watanabe et al. |
| 2012/0248399 | A1 | 10/2012 | Sasago et al. |
| 2013/0141968 | A1 | 6/2013 | Sasago et al. |
| 2013/0234101 | A1 | 9/2013 | Sasago et al. |
| 2014/0218999 | A1 | 8/2014 | Sasago et al. |
| 2015/0155479 | A1* | 6/2015 | Sasago ................... H01L 45/06 257/4 |

FOREIGN PATENT DOCUMENTS

| JP | 2007-180389 A | 7/2007 |
| JP | 2008-160004 A | 7/2008 |
| JP | 2010-165982 A | 7/2010 |
| JP | 2012-84676 A | 4/2012 |
| WO | WO 2011/074545 A1 | 6/2011 |
| WO | WO 2012/032730 A1 | 5/2012 |
| WO | WO 2012/070096 A1 | 5/2012 |
| WO | WO 2012/168981 A1 | 12/2012 |

* cited by examiner

Primary Examiner — Mark Prenty
(74) Attorney, Agent, or Firm — Miles & Stockbridge P.C.

(57) ABSTRACT

The purpose of the present invention is to provide a semiconductor storage device, which has small resistance in the ON state, and a small leak current in the OFF state, and which has a small-sized select transistor used therein. In this semiconductor storage device, a channel of a first select transistor that selects a memory cell array is electrically connected to each of the adjacent memory cell arrays (see FIG. 1).

13 Claims, 22 Drawing Sheets (a)

(b)

Reset / Set / Read operation (a)

(b)

Reset / Set / Read operation (a)

(b)

Reset / Set / Read operation (a)

(b)

Reset / Set / Read operation

Reset / Set / Read operation

Reset / Set / Read operation

Reset / Set / Read operation

SEMICONDUCTOR STORAGE DEVICE

TECHNICAL FIELD

The present invention relates to semiconductor storage devices.

BACKGROUND ART

In recent years, phase-change memories using chalcogenide materials as recording materials have been actively researched. Phase-change memory is a type of resistance random access memories that store information utilizing that the recording material between electrodes has different resistive states.

Phase-change memory stores information utilizing that the electric resistance of phase-change materials such as $Ge_2Sb_2Te_5$ is different between the amorphous state and the crystal state. The resistance is high in the amorphous state and is low in the crystal state. Therefore, the information is read out from the memory by providing the both ends of the element with an electric voltage difference, by measuring the electric current flowing through the element, and by identifying the high resistance state/low resistance state of the element.

Phase-change memory rewrites data by changing the electric resistance of the phase-change film into different state using Joule heat generated by electric current. Reset operation, i.e. an operation changing the phase-change material into highly resistive amorphous state, is performed by causing a large current to flow for short time to melt the phase-change material, and then by rapidly decreasing the current to rapidly cool the phase-change material. On the other hand, set operation, i.e. an operation changing the phase-change material into lowly resistive crystal state, is performed by causing, for long time, an electric current to flow that is sufficient for keeping the phase-change material at the crystallization temperature. This phase-change memory requires smaller current to change the state of the phase-change film as the size of the memory is miniaturized. Thus it is theoretically suitable for miniaturization. Therefore, the phase-change memory has been actively researched.

Patent Literature 1 listed below describes, as a method for highly integrating a phase-change memory, a configuration where: in a stack structure in which multiple of gate electrode materials and insulator films are stacked alternately, multiple through holes penetrating all layers are formed by collective processing; a gate insulator film, a channel layer, and a phase-change film are formed inside the through hole. Each of the memory cells includes a transistor and a phase-change element connected in parallel. The memory cells are serially connected in the vertical direction, i.e. in the normal direction with respect to the semiconductor substrate, thereby forming a phase-change memory chain. In the array structure in Patent Literature 1, a vertical select transistor selects each of the phase-change memory chains. The channel semiconductor layer of each select transistor has a structure separated for each of the phase-change memory chains.

In the example described in Patent Literature 2 listed below, a diode is used instead of select transistor to select each phase-change memory chain. Patent Literature 2 also discloses a configuration where: when further stacking multiple phase-change chains, the electrode terminals are shared between resistance-change chains of each layer in order to suppress increase in number of terminals to which independent electric voltages are provided; only the gate terminal of the newly added layer select transistor is independently operated.

CITATION LIST

Patent Literature

Patent Literature 1: JP Patent Publication (Kokai) 2008-160004 A
Patent Literature 2: WO 2011/074545

SUMMARY OF INVENTION

Technical Problem

The memory described in Patent Literature 1 has technical problems described below. In order to decrease bit costs, it is desirable to stack as many memory cells as possible. However, when many memory cells are stacked, the number of cells connected in series is increased. Thus the voltage between both ends of chain, which is necessary to flow an electric current required for rewrite operation of the phase-change memory, is increased. On the other hand, a voltage required for rewriting the selected chain is applied simultaneously to the non-selected chain. Thus it is necessary to prevent electric current from flowing through the non-selected chain by turning OFF the select transistor.

In order to stack as many cells as possible, it is necessary to suppress voltage drop by decreasing the ON resistance of the select transistor and to keep the voltage applied to the phase-change memory chain. On the other hand, in terms of the non-selected chain, it is necessary to suppress OFF leak current of the select transistor. Therefore, it is required for the select transistor to decrease the resistance in ON state and to decrease leak current between source/drain in OFF state. However, it may be difficult for the technique described in Patent Literature 1 to achieve both of them. For example, in order to decrease the resistance in ON state, the channel length of the select transistor may be decreased. However, it increases the leak current between source/drain in OFF state due to short channel effect.

In the technique described in Patent Literature 2, it is also required to decrease the resistance in ON state and to decrease the leak current in OFF state. However, it may be difficult to achieve both of them. In other words, regarding the diode described in Patent Literature 2 that is used instead of the select transistor, it may be difficult to decrease the resistance in forward bias ON state and to decrease the leak current in reverse bias OFF state simultaneously.

For example, the technical problem mentioned above regarding the select transistor may be solved by increasing the channel width of each of the select transistors and then by increasing the channel length of the select transistor. However, it also increases the size of the select transistor, which decreases the memory cell density in the in-plane direction of the semiconductor substrate. It prevents bit costs from being decreased.

The present invention is made in the light of the above-described technical problems. It is an objective of the present invention to provide a semiconductor storage device using a select transistor which resistance in ON state and which leak current in OFF state are both small and which size is small.

Solution to Problem

In a semiconductor storage device according to the present invention, a channel of a first select transistor that selects a memory cell array is electrically connected with each adjacent memory cell array.

Technical problems, configurations, and effects other than mentioned above will be understood with reference to descriptions of embodiments below.

Advantageous Effects of Invention

With the semiconductor storage device according to the present invention, it is possible to manufacture a preferable memory cell array by densification to achieve increasing capacity and decreasing bit cost of the semiconductor storage device.

DESCRIPTION OF EMBODIMENTS

Hereinafter, embodiments of the present invention will be described in details with reference to figures. In all figures describing the embodiments, same reference signs are assigned to members having same functionalities, and repetitive description will be omitted. Portions described for characteristic configurations are not limited to the embodiments. It is noted that a same configuration achieves a same effect.

Embodiment 1

Figure 1:
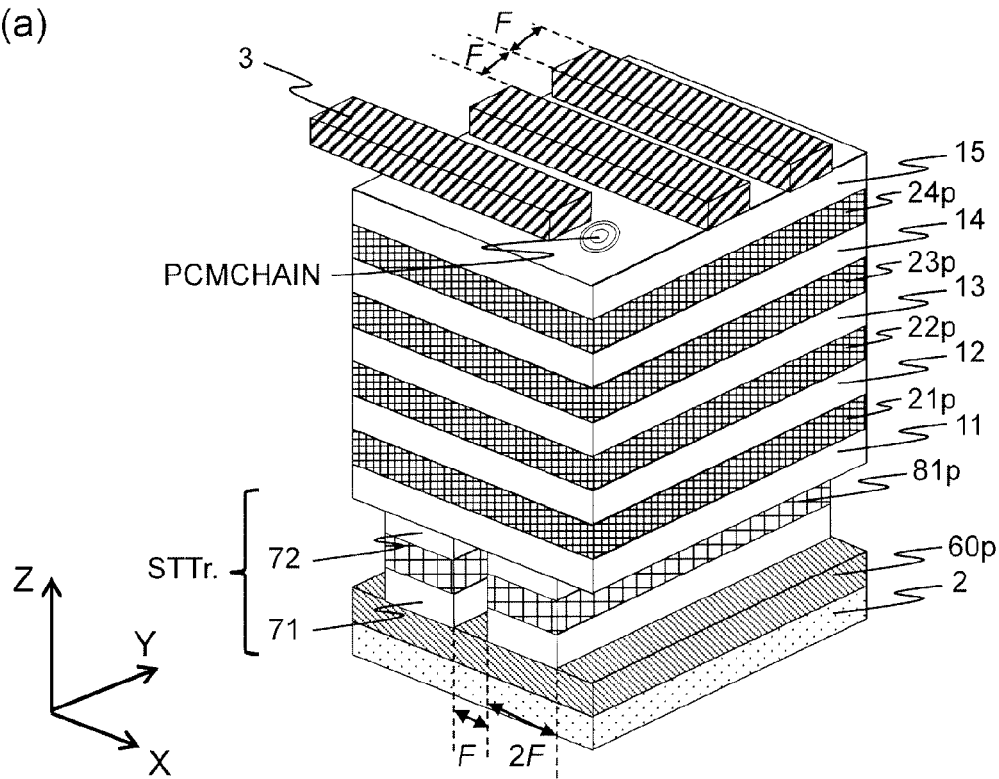
FIG. 1(a) is a schematic cubic diagram showing a configuration of a memory cell array portion of a semiconductor storage device according to an embodiment 1.
FIG. 1(b) is an XZ sectional diagram of the schematic cubic diagram of FIG. 1(a) according to embodiment 1.
Figure 1:
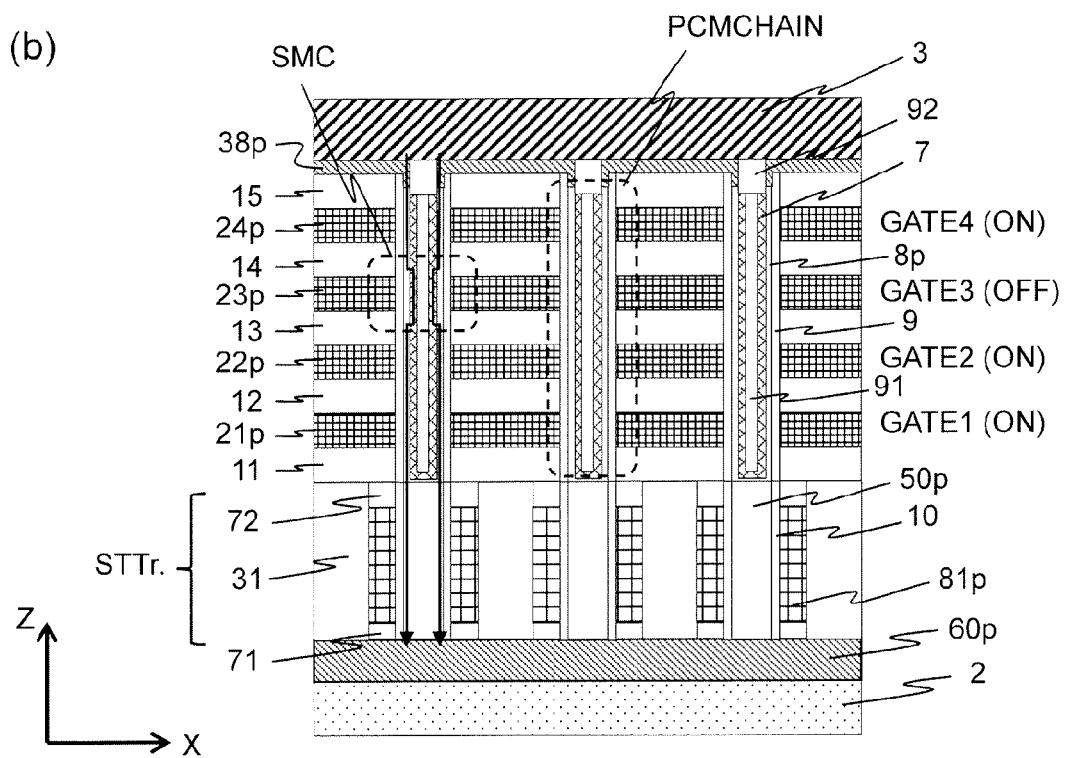

FIG. 1 is a diagram showing a configuration of a memory cell array portion of a semiconductor storage device according to an embodiment 1 of the present invention. FIG. 1(a) is a schematic cubic diagram of a portion of the semiconductor device. FIG. 1(b) is a XZ sectional diagram of FIG. 1(a).

The electrode 3 works as a bit line (selection electrode) that is extended in the X direction and that selects the phase-change memory chain PCMCHAIN in the Y direction. A stacked body is disposed below the electrode 3 in which a plurality polysilicon layers $21p$, $22p$, $23p$, and $24p$ working as cell gate electrodes and insulator films 11, 12, 13, 14, and 15 are alternately stacked. The phase-change memory chain PCMCHAIN is formed in the Z direction hole formed in the stacked body. The select transistor STTR. includes a gate electrode $81p$, a gate insulator film 10, and a channel semiconductor layer $50p$. Insulating films 71, 72, and 31 are disposed around the select transistor STTr. A planar electrode 2 is disposed below the select transistor STTr. A N-type semiconductor layer $38p$ electrically connects the electrode 3 with PCMCHAIN. An insulator film 92 is formed between the electrode 3 and PCMCHAIN. A N-type semiconductor layer $60p$ electrically connects the electrode 2 with the channel semiconductor layer $50p$. PCMCHAIN formed in the hole of the stacked body includes a gate insulator film 9, a channel semiconductor layer $8p$, a phase-change material layer 7, and an insulator film 91.

In FIG. 1, the bit line 3 extending in the X direction and the gate electrode $81p$ of the select transistor STTr. extending in the Y direction may be formed by 2F pitch and 3F pitch respectively. F is the minimum feature size. In other words, a memory cell can be formed having a projection area size of $6F^2$ in the XY plane.

Materials such as $Ge_2Sb_2Te_5$ that store information utilizing different resistances between the amorphous state and the crystal state may be used as the phase-change material layer 7. An operation changing from the highly resistive amorphous state into the lowly resistive crystal state, i.e. set operation, is performed by heating the phase-change material in amorphous state above the crystallization temperature, and by keeping the temperature for approximately more than $10^{-6}$ second to turn the material into crystal state. The phase-change material in crystal state can be changed into amorphous state by heating the material above the melting temperature to turn the material into liquid state, and then by cooling the material rapidly.

Figure 2:
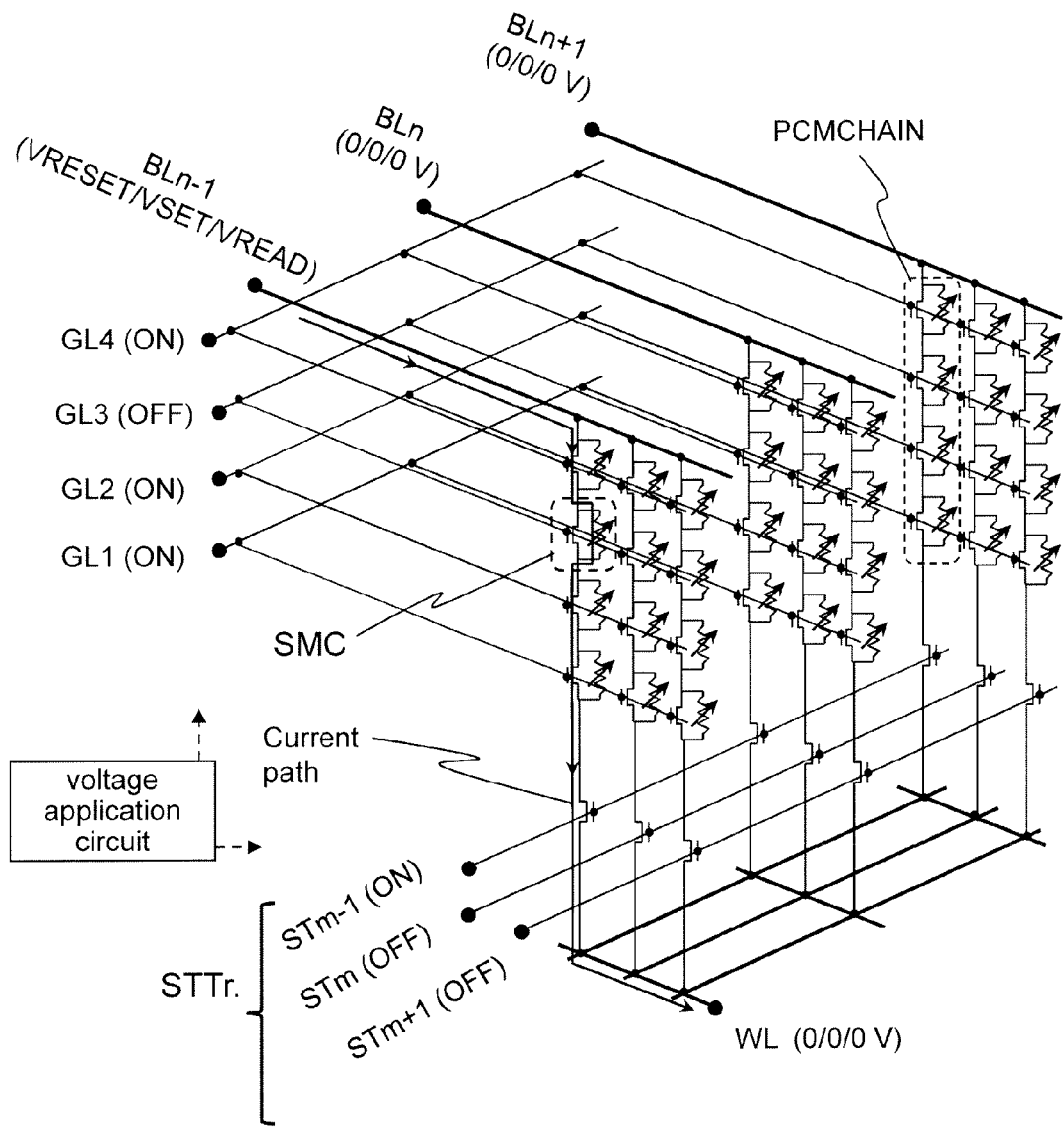
FIG. 2 is an equivalent circuit diagram of the semiconductor storage device of FIG. 1(a).

FIG. 2 is an equivalent circuit diagram of the semiconductor storage device of FIG. 1. Voltage conditions for read operation/set operation/reset operation are also described in the figure. Each memory cell is constructed by a cell transistor and a phase-change memory connected in parallel. PCMCHAIN is formed by serially connecting memory cells. The voltage application circuit is a circuit that applies electric voltages to each electrode. Embodiments described below comprise the voltage application circuit.

When selecting a cell in PCMCHAIN, an electric voltage difference is applied to both ends of the serially connected memory cells, an ON voltage of cell transistor is applied to the cell gate of non-selected memory cells, and an OFF voltage of cell transistor is applied to the cell gate of the selected cell (SMC). Accordingly, an electric current flows through the transistor in the non-selected cells, and an electric current flows through the phase-change material layer 7 in SMC. Namely, the electric current flows through the phase-change material layer 7 of the selected cell only, thereby reading or writing information.

Reset operation/set operation are performed using Joule heat of the electric current flowing through the phase-change material layer 7 of SMC. Read operation is performed by detecting the electric current flowing through the phase-change material layer 7 of SMC to identify the resistive state.

The select transistor STTr. is used for selecting PCMCHAIN. ON voltage is applied to the gate of the select transistor STTr. connected to PCMCHAIN including SMC. OFF voltage is applied to the gates of the other select transistors STTr. A voltage corresponding to reset/set/read operation (VRESET/VSET/VREAD) is applied to the bit line 3 connected to PCMCHAIN including SCM. 0V is applied to other ones of the bit lines 3 (non-selected bit line), which is the same voltage as that of the wire configured by the lower electrode 2 (word line WL). Accordingly, an electric voltage difference is provided only to the both ends of PCMCHAIN including SMC. As a result, it is possible to selectively operate the device by selecting SMC only.

Figure 3:
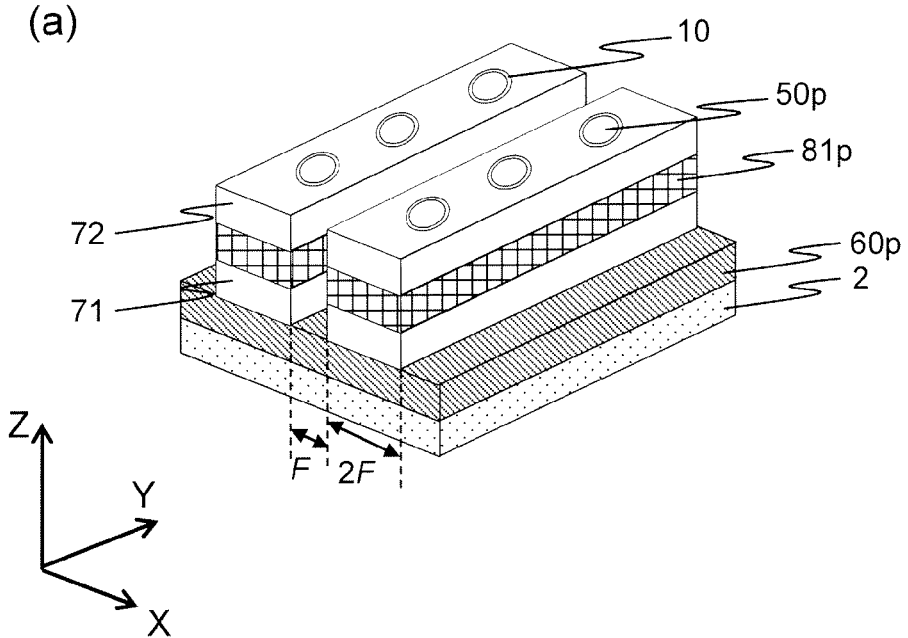
FIG. 3(a) is a schematic cubic diagram of a conventional select transistor STTr configuration.
FIG. 3(b) is a schematic cubic diagram of a configuration of a select transistor STTr according to the embodiment 1.
Figure 3:
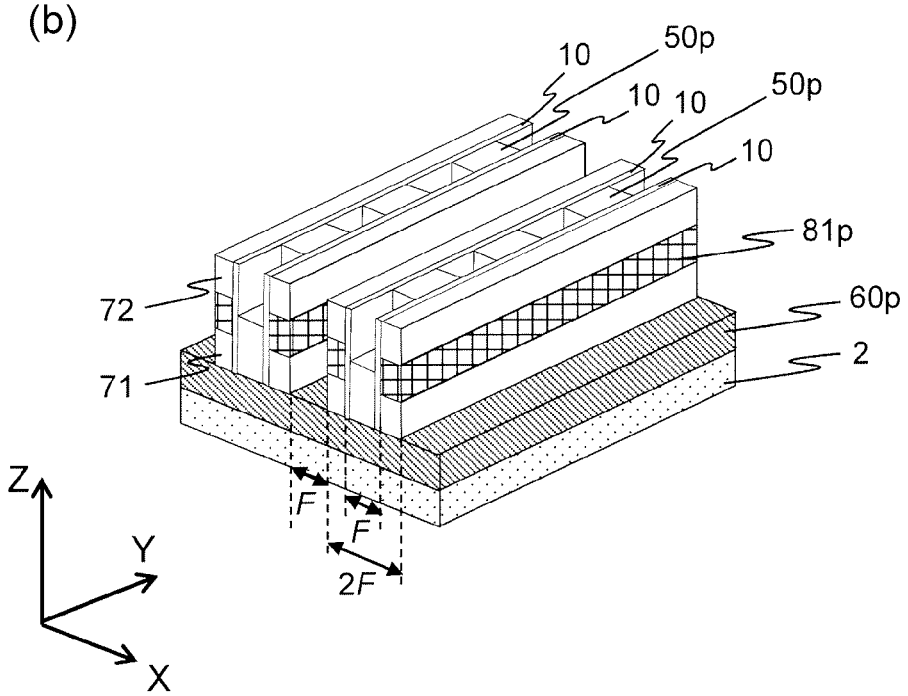

FIG. 3 is a schematic cubic diagram of the select transistor STTr. For the sake of comparison, FIG. 3(a) shows a configuration of conventional select transistor STTr. and FIG. 3(b) shows the configuration of the select transistor STTr. of the embodiment 1.

In the conventional configuration shown in FIG. 3(a), the channel semiconductor layers 50p of the select transistor STTr. are separated for each PCMCHAIN in the Y direction. On the other hand, in the configuration of the embodiment 1 shown in FIG. 3(b), the channel semiconductor layer 50p is shared between PCMCHAINs adjacent each other in the Y direction. In other words, the channel semiconductor layer 50p of one of the select transistors STTr. for selecting a PCMCHAIN is electrically connected with the channel semiconductor layer 50p of another one of the select transistors STTr. for selecting another PCMCHAIN adjacent in the Y direction.

Figure 4:
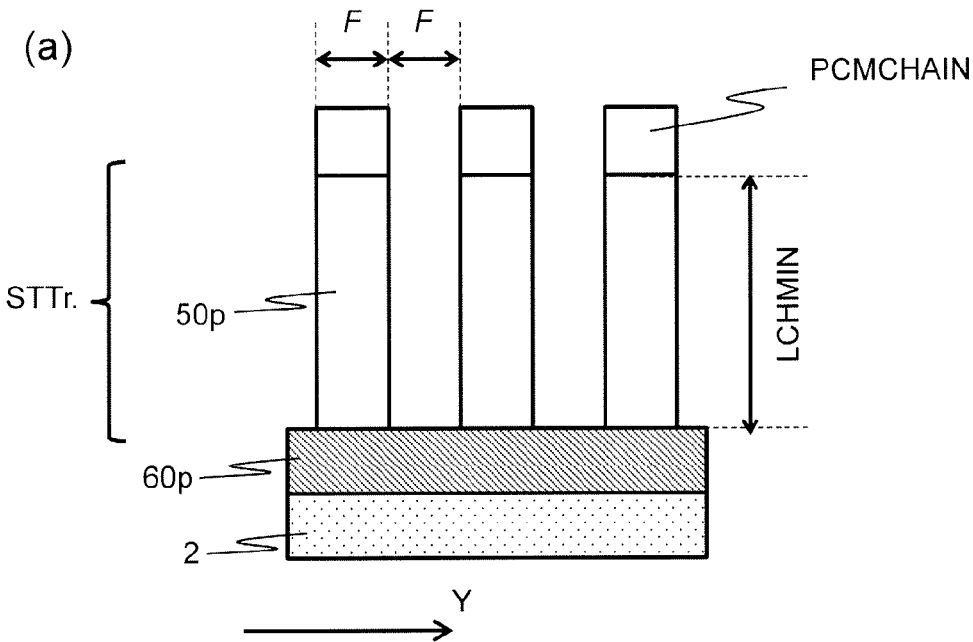
FIG. 4(a) is a YZ sectional diagram of the conventional select transistor STTr configuration of FIG. 3(a).
FIG. 4(b) is a YZ sectional diagram of the select transistor STTr configuration of FIG. 3(b) according to the embodiment 1.
Figure 4:
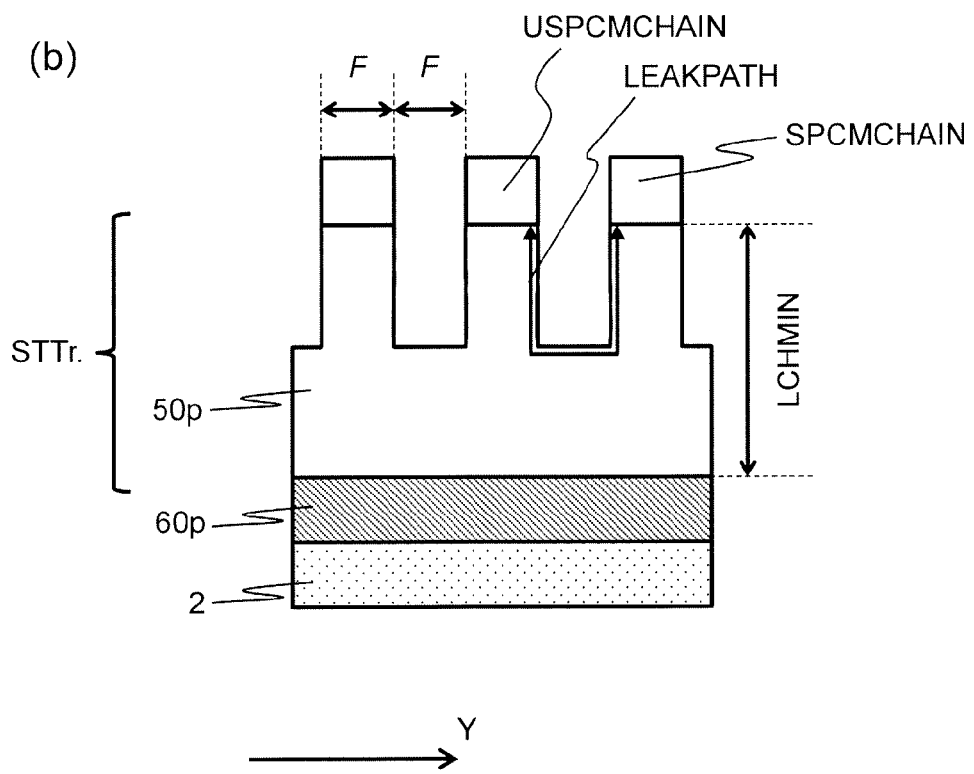

FIG. 4 is a YZ sectional diagram of FIG. 3. FIG. 4(a)(b) each correspond to FIG. 3(a)(b). Hereinafter, the difference between the conventional select transistor STTr. and the select transistor STTr. in the embodiment 1 will be described in details using FIG. 4.

One of characteristics required for the select transistor STTr. is that the withstand voltage between source/drain in OFF operations must be at or more than the electric voltage difference between the selected bit line voltage (VRESET/VSET/VREAD) and the word line voltage (0V). The withstand voltage between source/drain can be achieved by increasing the channel length of STTr. However, it also increases the resistance between source/drain during ON operation, which increases the voltage drop. Therefore, the voltage applied to both ends of the selected chain SPCMCHAIN is decreased. On the other hand, if the number of serially connected memory cells in a chain cell is increased, the number of non-selected cells serially connected with SMC is also increased, thereby increasing the voltage drop at non-selected cells. Therefore, it is necessary to apply larger voltages to both ends of SPCMCHAIN. Because of the above-described reasons, if the voltage drop between source/drain of STTr. connected to SPCMCHAIN is increased, the number of cells that can be stacked shown in FIGS. 1 and 2 is decreased, which prevents bit costs from being decreased.

It is necessary to keep the channel length of the select transistor STTr. at or more than a minimum length LCHMIN that can keep the withstand voltage between source/drain. Thus in the embodiment 1, a configuration shown in FIG. 4(b) is employed to keep the channel length of the select transistor STTr. at or more than LCHMIN and to reduce the resistance between source/drain during N operation.

In the conventional configuration shown in FIG. 4(a), the channel length of the select transistor STTr. is kept more than LCHMIN. On the other hand, an electric current flows through the channel semiconductor layer 50p with a width of F, which causes high electric resistance.

In the configuration of the embodiment 1 shown in FIG. 4(b), a recess is provided at the channel semiconductor layer 50p between adjacent PCMCHAINs. By configuring the depth of the recess appropriately, the channel length of the select transistor STTr. may be kept at or more than LCHMIN. Specifically, the interval between adjacent PCMCHAINs is F. Thus the depth of the recess may be at or more than (LCHMIN-F)/2, thereby keeping the leak current path (LEAKPATH) at or more than LCHMIN. It is equivalent to keeping the channel length at or more than LCHMIN. Accordingly, a withstand voltage can be kept at or more than the voltage difference between the electrical voltage (VRESET/VSET/VREAD) of the bit line 3 (SBL) of the selected chain (SPCMCHAIN) and the electrical voltage (0V) of the bit line 3 (USBL) of the non-selected chain (USPCMCHAIN) that are adjacent in the Y direction. Further, as described in FIG. 5 later, the electric current flows into the Y direction in spread manner because the channel semiconductor layer 50p is continuous in the Y direction. Thus the resistance is significantly decreased from FIG. 4(a).

Figure 5:
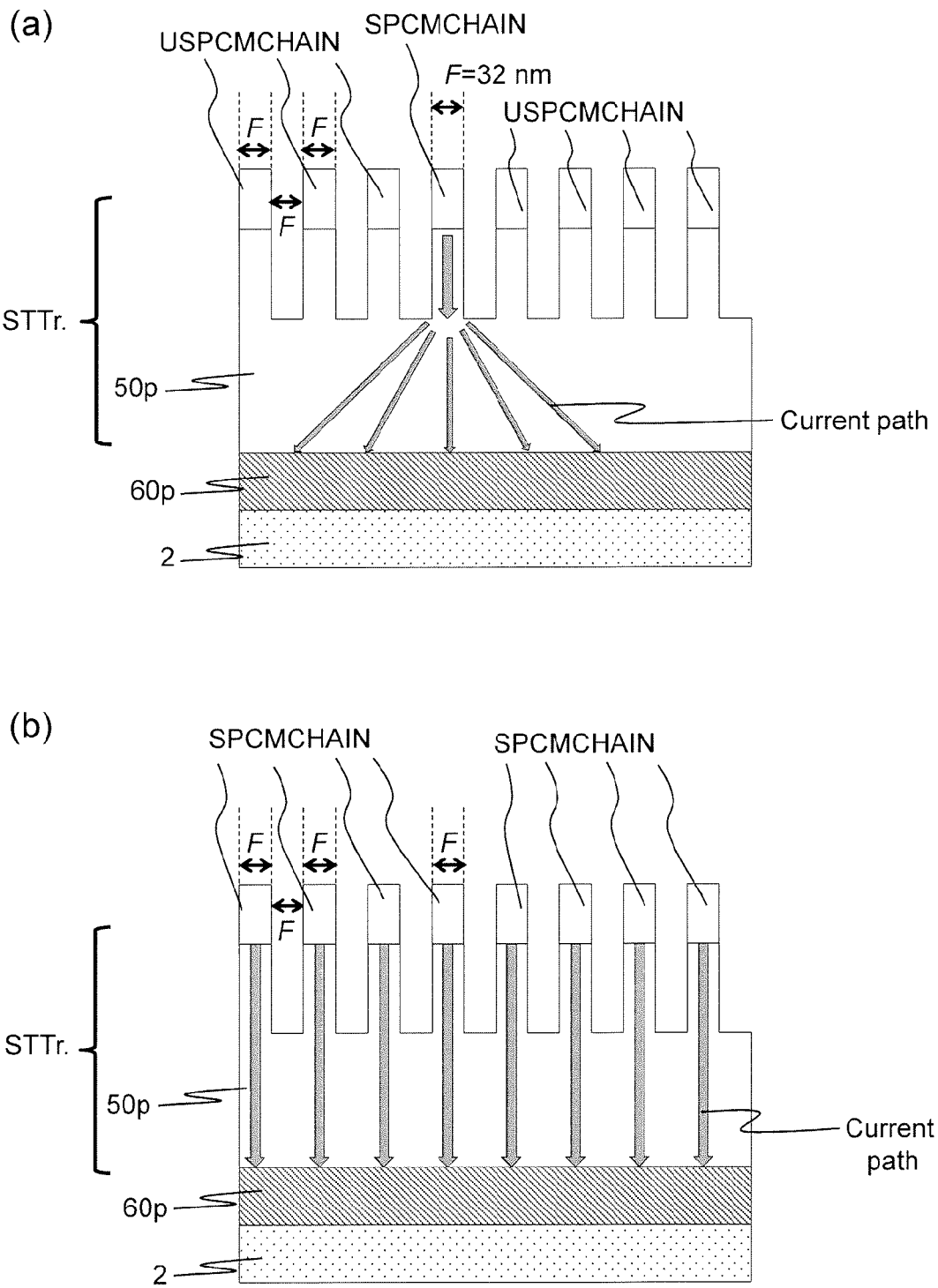
FIG. 5(a) is a diagram showing electric current flows through a channel semiconductor layer 50p in the embodiment 1 when a phase-change memory chain is selected and adjacent phase-change memory chains are not selected.
FIG. 5(b) is a diagram showing electric current flows through a channel chains are densely selected.

FIG. 5 is a diagram showing that an electric current flows through the channel semiconductor layer 50p in the embodiment 1. As shown in FIG. 5(a), the current density at the portion of the channel semiconductor layer 50p where the width in Y direction is F is the same as that of the conventional configuration. However, since the electric current flows into the Y direction in spread manner at the portion shared in the Y direction, it may be deemed that the resistance is low. Considering those portions totally, it may be deemed that the channel semiconductor layer 50p in the embodiment 1 has a lower resistance than the conventional configuration.

It is noted that the effect in FIG. 5(a) is achieved when PCMCHAIN is sparsely selected in the Y direction. As shown in FIG. 5(a), if adjacent PCMCHAINs are not selected, the electric current flowing through SPCMCHAIN flows into the Y direction in spread manner within the channel semiconductor layer 50p. However, as shown in FIG. 5(b), if PCMCHAINs are densely selected in the Y direction, there is no margin for the electric currents flowing through each SPCMCHAIN to spread in the Y direction. Thus the effect for decreasing the resistance is small.

Embodiment 1

Summary

As discussed thus far, with the semiconductor storage device according to the embodiment 1, it is possible to keep the channel length for keeping the withstand voltage between source/drain in OFF operation, while decreasing the channel resistance in ON operation. Accordingly, it is possible to increase the number of cells that can be stacked in PCMCHAIN. As a result, it is possible to increase capacity and to decrease bit costs of the semiconductor storage device.

Embodiment 2

In the semiconductor storage device according to the embodiment 1, the pitch between memory cells in the X direction is 3F. Thus together with the pitch 2F in the Y direction, the projected area size of the memory cell in the XY plane is $6F^2$. In an embodiment 2 of the present invention, a configuration example will de described where the pitch of the memory cell in the X direction is 2F, so that the projected area size of the memory cell in the XY plane is $4F^2$.

Figure 6:
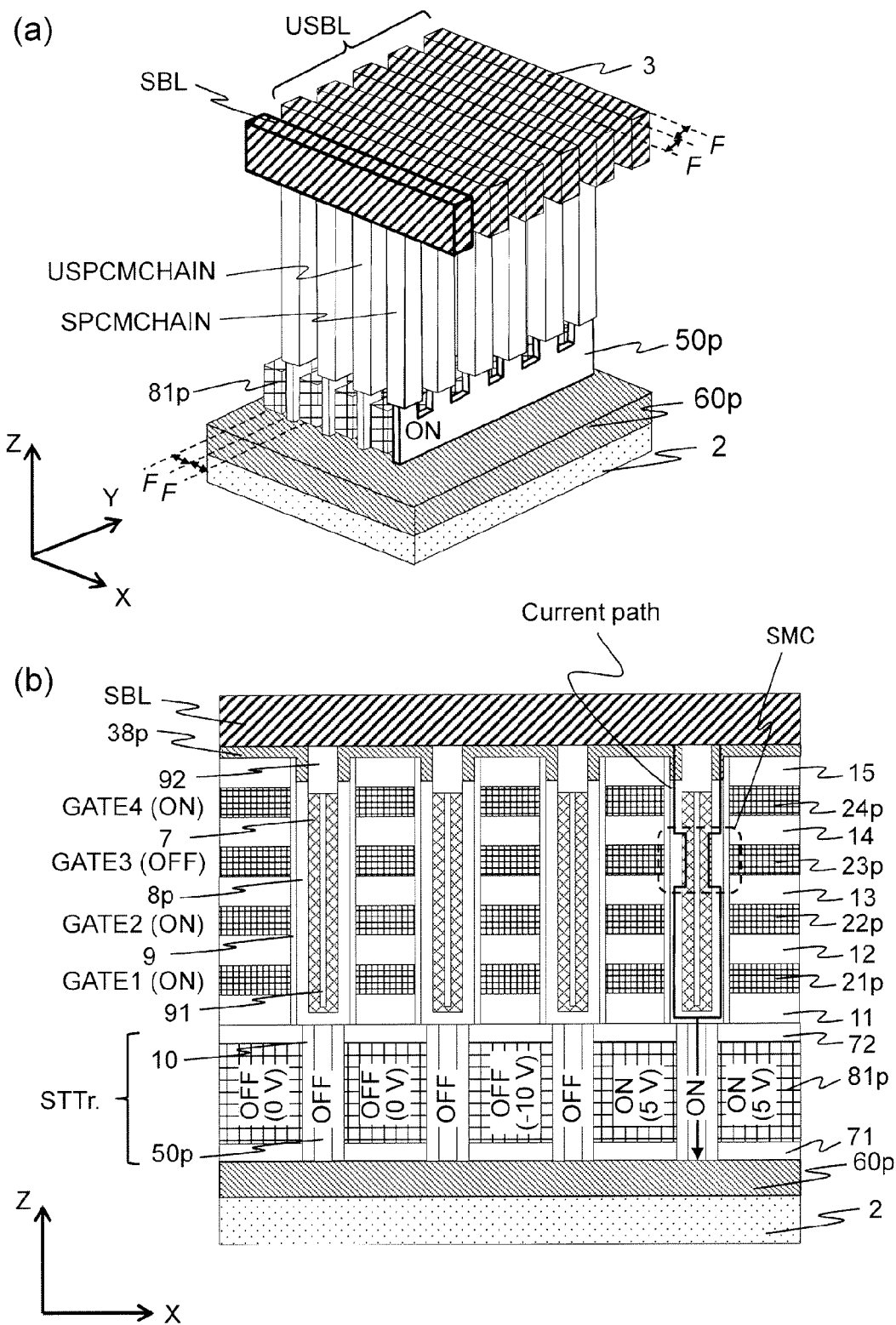
FIG. 6(a) is sa schematic cubic diagram showing a configuration of a memory cell array portion of a semiconductor storage device according to an embodiment 2.
FIG. 6(b) is an XZ sectional diagram of the schematic cubic diagram of FIG. 6(a) according to the embodiment 2.

FIG. 6 is s diagram showing a configuration of a memory cell array portion of a semiconductor storage device according to the embodiment 2. FIG. 6(a) is a schematic cubic diagram of a portion of the semiconductor storage device. FIG. 6(b) is a XZ sectional diagram of FIG. 6(a). For the sake of simplicity, some portions such as cell gates or gate insulator films are omitted in the figure.

The difference from the embodiment 1 is that the gate electrode 81p of the select transistor STTr. does not have a groove for separating in the X direction, i.e. a space with size of F into which the insulator film 31 is embedded. Thus in STTr. of the semiconductor storage device shown in FIG. 6(a), the gate electrode 81p is sandwiched by the channel semiconductor layer 50p through gate insulator films 10 from both sides in the X direction. This configuration achieves that both of the pitch of STTr. in the X direction and the pitch of PCMCHAIN formed above STTr. and connected to STTr. are 2F. As mentioned later, however, since the insulator film 31 is omitted, when applying ON voltage to one of the gate electrodes 81p, the channel semiconductors 50p at both sides of the gate electrode 81p are turned ON.

In the configuration shown in FIG. 6, as in the embodiment 1, the channel semiconductor layer 50p of STTr. is continuous in the Y direction, and a recess as in FIG. 4 is formed at the upper surface of the channel semiconductor layer 50p. Accordingly, the leak current between SPCMCHAIN and USPCMCHAIN adjacent in the Y direction can be suppressed.

One of technical problems of the select transistor STTr. shown in FIG. 6 is that: when applying ON voltage to one of the gate electrodes 81p, the channel semiconductor layers 50p at both sides of that gate electrode 81p in the X direction are both turned ON, thereby selecting two portions in the X direction simultaneously. The technical problem is addressed as below in the embodiment 2.

If the thickness of the channel semiconductor layer 50p, i.e. the size TSi in the X direction, is sufficiently small, the channel semiconductor layer 50p can be turned OFF even when ON voltage is applied to one of the gate electrodes 81p at both sides of the channel semiconductor layer 50p, by applying strong OFF voltage to anther one of the gate electrode 81p.

For example, as shown in FIG. 6(b), regarding the channel semiconductor layer 50p to be turned ON (rightmost), ON voltage (5V in FIG. 6(b)) is applied to both sides of the gate electrodes 81p. In addition, regarding the channel semiconductor layer 50p (second from rightmost) that is in contact with the gate electrode 81p through the gate insulator film 10 to which 5V is applied and that is to be turned OFF, OFF voltage stronger than usual (-10V in FIG. 6(b)) is applied to the another side of the gate electrode 81p. The channel semiconductor layer 50p where 5V is applied to both gates is turned ON. The channel semiconductor layer 50p where 5V and -10V are applied is turned OFF. The channel semiconductor layer 50p where both gates are 0V is turned OFF. The channel semiconductor layer 50p where both gates are 0V and -10V respectively is turned OFF. Accordingly, only the channel semiconductor layer 50p where 5V is applied to both gates is turned ON. Namely, PCMCHAIN can be selected in the X direction.

Figure 7:
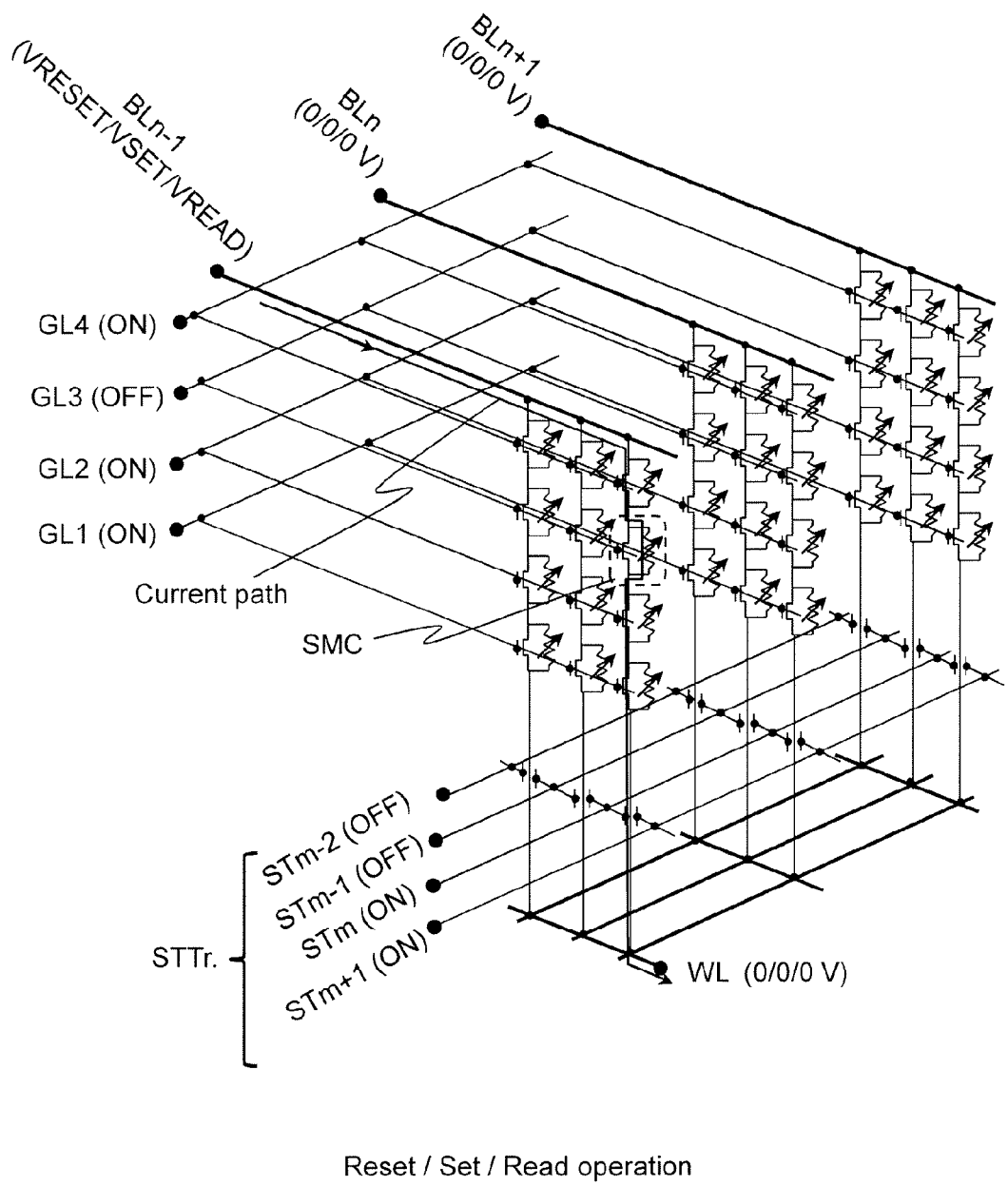
FIG. 7 is an equivalent circuit diagram of the semiconductor storage device of FIG. 6(a).

FIG. 7 is an equivalent circuit diagram of the semiconductor storage device of FIG. 6. Voltage conditions of read operation/set operation/reset operation are also described in the figure. The method for selecting cells in PCMCHAIN and the method for reading/writing information with respect to memory cells are the same as those of the embodiment 1. Thus the method for selecting PCMCHAIN will be described.

ON voltage (e.g. 5V) is applied to two gates of STTr. connected with PCMCHAIN including SMC. OFF voltage (e.g. 0V) is applied to gates of other STTr. OFF voltage stronger than usual (e.g. -10V) is applied to the gate of STTr. that is connected with the gate of STTr. to which ON voltage is applied and that is to be turned OFF. A voltage corresponding to reset/set/read operations is applied to the bit line 3 connected with PCMCHAIN including SMC. 0V is applied to other bit lines 3 (non-selected bit lines) as to the wire (word line WL) formed by the lower electrode 2. Accordingly, a voltage difference can be provided only to both ends of PCMCHAIN including SMC. As a result, only SMC can be selected to operate the semiconductor storage device selectively.

Figure 8:
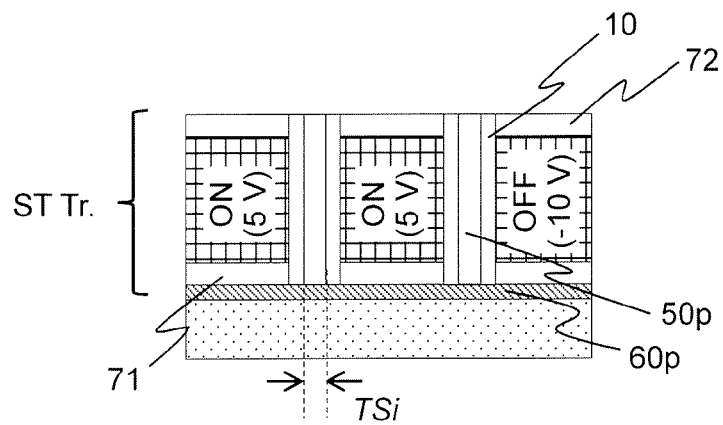
FIG. 8(a) sectional diagram of a structure of a select transistor STTr, in the embodiment 2.
FIG. 8(b) is a diagram showing characteristics of a select transistor STTr, in the embodiment 2.
Figure 8:
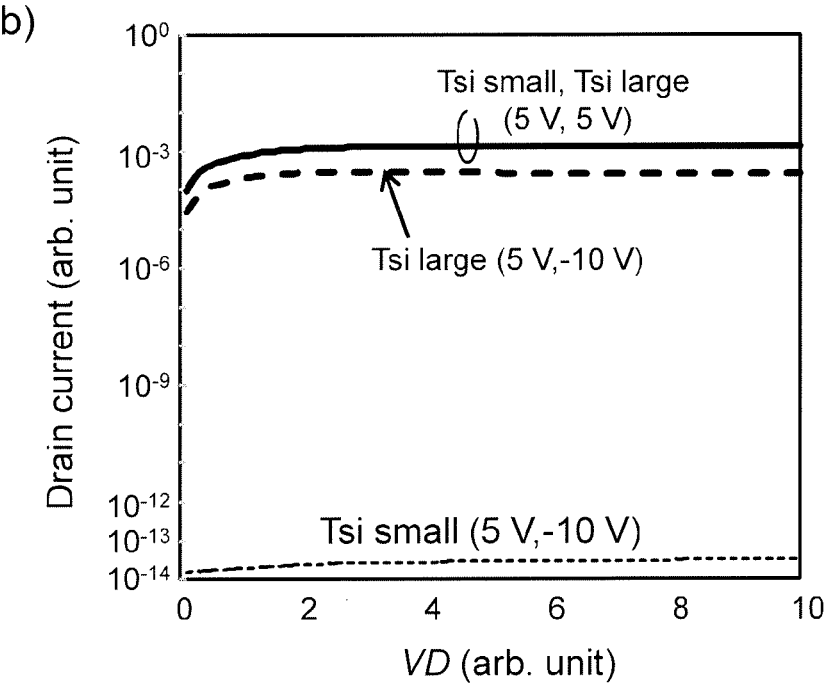

FIG. 8 is a diagram showing characteristics of the select transistor STTr. in the embodiment 2. FIG. 8(a) shows the structure of STTr. and the film thickness of the channel semiconductor layer 50p. FIG. 8(b) shows a dependency of STTr. on drain current/drain voltage (VD). In FIG. 8, the characteristic when the voltages of two gates are 5V is shown with (5V, 5V). The characteristic when the voltages of two gates are 5V and -10V is shown with (5V, -10V).

In the characteristics shown in FIG. 8, when the gate voltages are (5V, 5V), similar characteristics are achieved regardless of the magnitude of TSi. When the film thickness TSi of the channel semiconductor layer 50p is large, the difference of drain current between when the gate voltages are (5V, 5V) and when the gate voltages are (5V, -10V) is small. Namely, ON/OFF operations of STTr. may not be sufficiently performed. However, when TSi is sufficiently small, the difference of drain current between when the gate voltages are (5V, 5V) and when the gate voltages are (5V, −10V) is large. Thus ON/OFF operations of STTr. may be sufficiently performed.

Embodiment 2

Summary

As discussed thus far, the semiconductor storage device according to the embodiment 2 can, as in the embodiment 1, keep the channel length for keeping the withstand voltage between source/drain in OFF operation of the select transistor STTr., while decreasing the channel resistance in ON operation.

In addition, the semiconductor storage device according to the embodiment 2 achieves the projected area size $4F^2$ of the memory cell in the XY plane, while achieving the same effect as that of the embodiment 1. Thus it is advantageous in increasing the capacity and decreasing bit costs of the semiconductor storage device.

Embodiment 3

In the embodiment 2, multiple of the wire configured by the upper electrode 3 are formed by a pitch 2F as bit lines extending in the X direction. In an embodiment 3 of the present invention, a configuration example will be described where the upper electrode 3 is formed in a plate-like shape as the shape of the lower electrode 2. In the configuration of the embodiment 3, it is also possible to achieve the projected area size $4F^2$ of the memory cell in the XY plane by configuring the pitch 2F in the X/Y directions.

Figure 9:
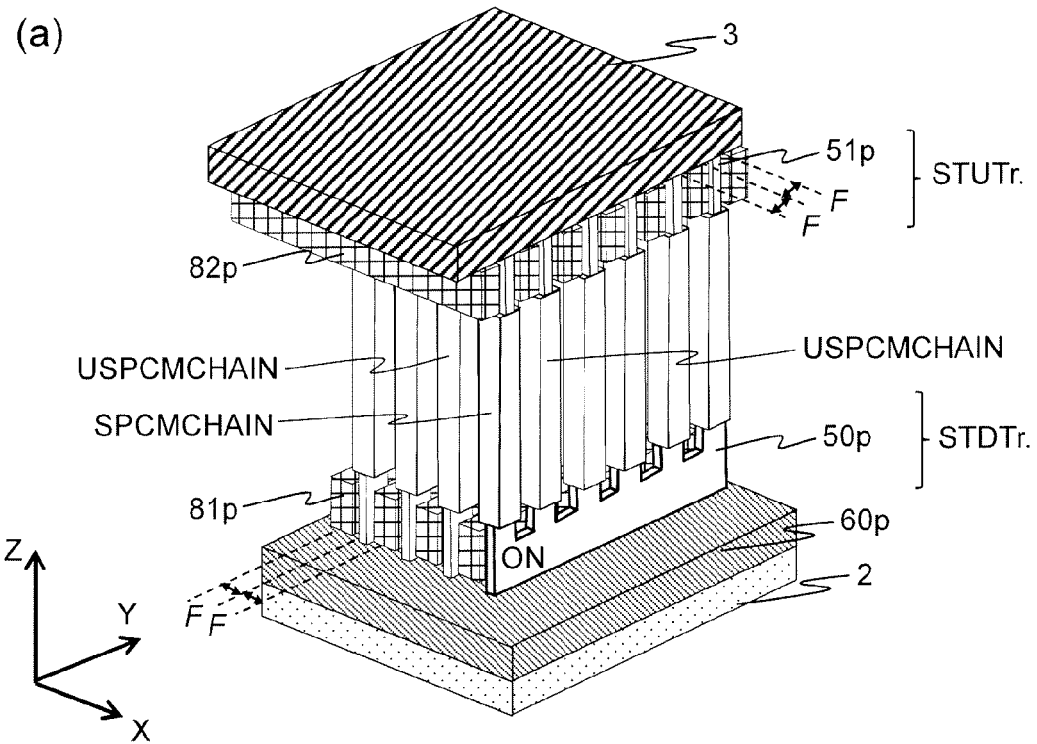
FIG. 9(a) is a schematic cubic diagram showing a portion of a memory cell array portion of a semiconductor storage device according to an embodiment 3.
FIG. 9(b) is a diagram showing a leak current flow in the portion of a memory cell array portion of FIG. 9(a) according to the embodiment 3.
Figure 9:
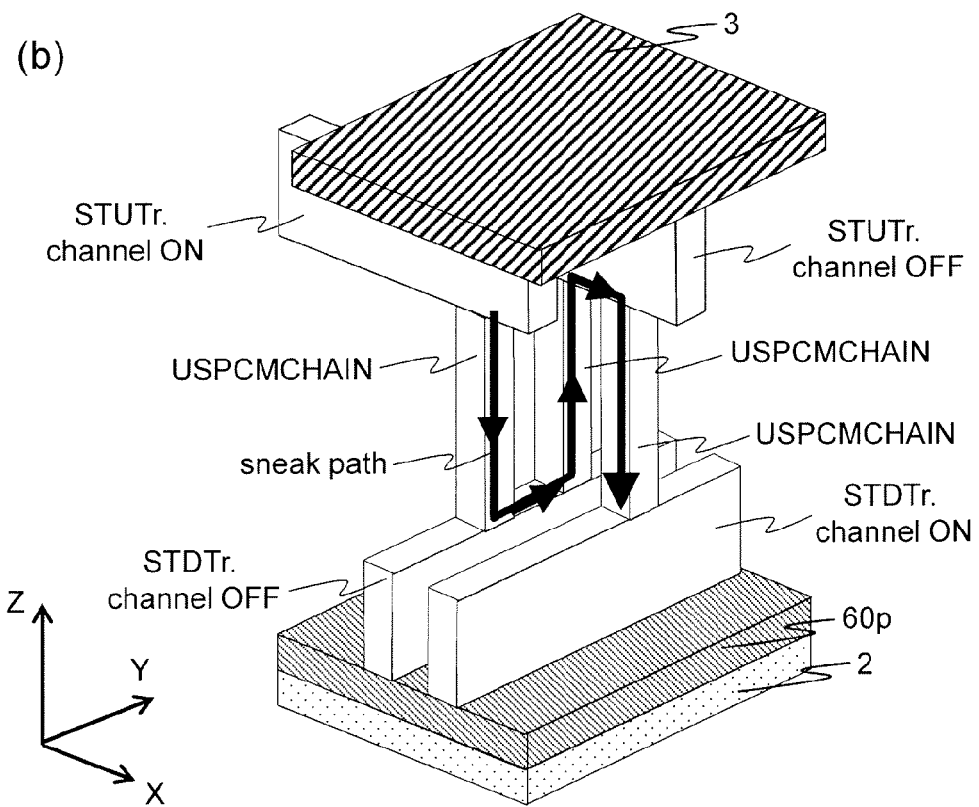

FIG. 9 is a schematic cubic diagram showing a portion of a memory cell array portion of a semiconductor storage device according to the embodiment 3. For the sake of simplicity, some portions such as cell gates or gate insulator films are omitted in the figure. The difference from FIG. 6 of the embodiment 2 is that: the bit line 3 is in the form of plate; and the select transistor is formed by two stages of the lower STDTr. and the upper STUTr. STUTr. is provided for selecting PCMCHAIN in the Y direction in the light of the plate-like bit line 3.

The gate electrode 81p of the lower select transistor STDTr. is formed by 2F pitch extending in the Y direction as in the embodiment 2. The gate electrode 82p of the upper select transistor STUTr. is formed by 2F pitch extending in the X direction perpendicular to 81p. The channel semiconductor 50p of STDTr. is continuous in the Y direction. The channel semiconductor 51p of STUTr. is continuous in the X direction.

STDTr. has a structure where the gate electrode 81p is formed at both sides of the channel semiconductor layer 50p through gate insulator films, as that of FIG. 8(a). STUTr. similarly has a structure where the gate electrode 82p is formed at both sides of the channel semiconductor layer 51p through gate insulator films. A recess is formed in the channel semiconductor layer 50p of STDTr. in order to suppress the leak current between selected cells and non-selected cells, as in the embodiments 1 and 2. No such recess is necessary in the channel semiconductor 51p of STUTr. The reason thereof will be described in FIG. 9(b).

In the semiconductor storage device of the embodiment 3, PCMCHAIN is selected by turning ON STDTr. and STUTr. simultaneously. The leak current flows between the upper electrode 3 and the lower electrode 2 through (a) USPCMCHAIN where STUTr. is ON and STDTr. is OFF, (b) USPC-MCHAIN where STUTr. is OFF and STDTr. is OFF, and (c) USPCMCHAIN where STUTr. is OFF and STDTr. is ON. The current path is shown as sneak path in FIG. 9(b).

The leak current of sneak path always flows through the channel semiconductor layer 50p in the Y direction where STDTr. is OFF. Therefore, the leak current can be suppressed by forming a recess as FIG. 9(a) only in the channel semiconductor layer 50p of STDTr. The leak current can be suppressed by forming a recess not in the channel semiconductor layer 50p of STDTr. but in the channel semiconductor layer 51p of STUTr., as may be understood from the symmetry. In other words, the leak current can be suppressed by forming a recess in anyone of STDTr. or STUTr.

Figure 10:
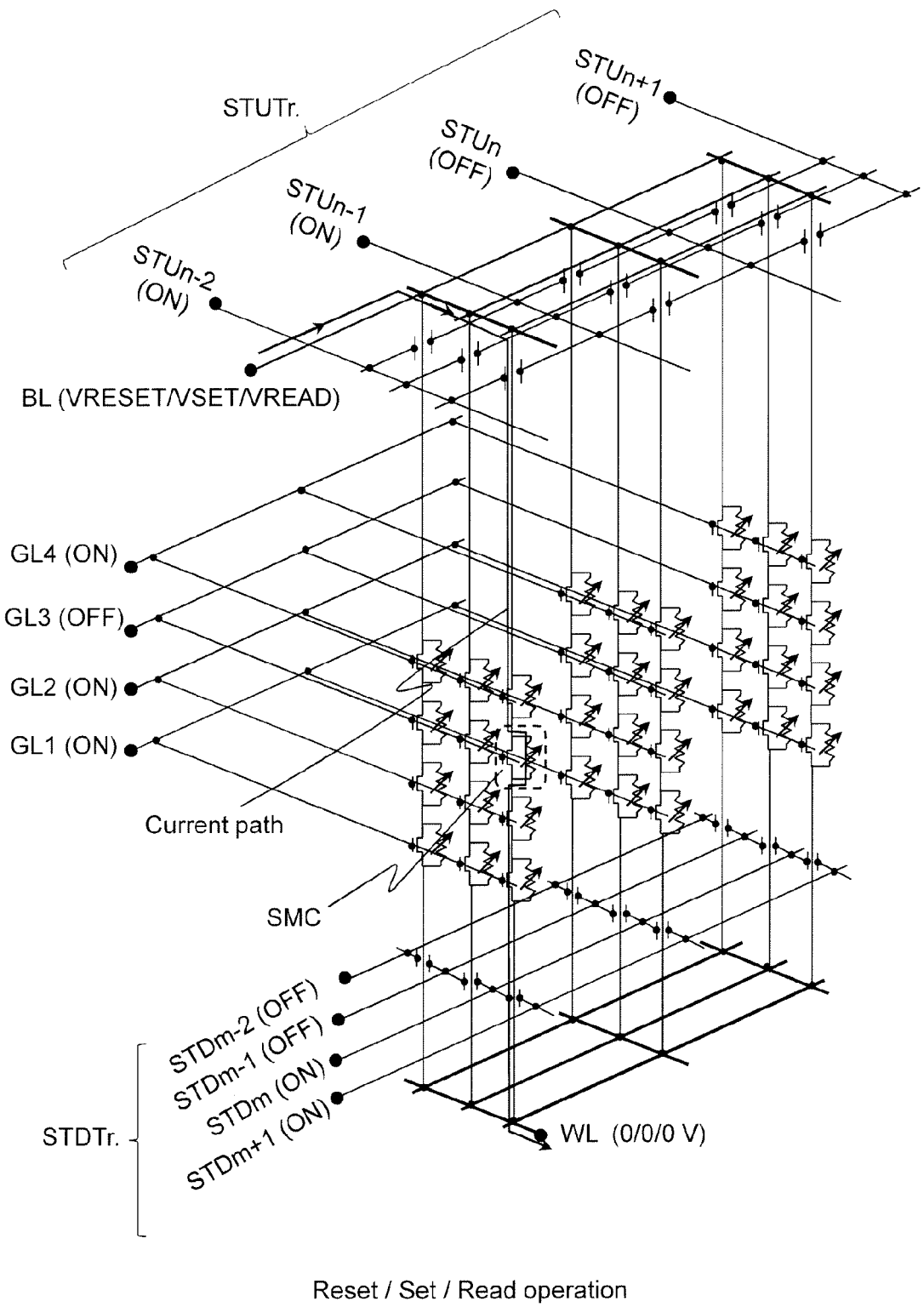
FIG. 10 is an equivalent circuit diagram of the semiconductor storage device shown in FIG. 9(a).

FIG. 10 is an equivalent circuit diagram of the semiconductor storage device shown in FIG. 9(a). Voltage conditions of read operation/set operation/reset operation are also described in the figure. The method for selecting cells in PCMCHAIN and the method for reading/writing information with respect to memory cells are the same as those of the embodiments 1 and 2. Thus the method for selecting PCMCHAIN will be described. In the embodiment 3, both of STDTr. and STUTr. are used when selecting PCMCHAIN.

ON voltage (e.g. 5V) is applied to two gate electrodes 81p of STDTr. connected with PCMCHAIN including SMC. OFF voltage (e.g. 0V) is applied to the gate electrodes 81p of other STDTrs. OFF voltage stronger than usual (e.g. −10V) is applied to the gate electrode 81p of STDTr. that is connected with the gate electrode 81p of STDTr. to which ON voltage is applied and that is to be turned OFF.

ON voltage (e.g. 5V) is applied to two gate electrodes 81p of STUTr. connected with PCMCHAIN including SMC. OFF voltage (e.g. 0V) is applied to the gate electrodes 82p of other STUTrs. OFF voltage stronger than usual (e.g. −10V) is applied to the gate electrode 82p of STUTr. that is connected with the gate electrode 82p of STUTr. to which ON voltage is applied and that is to be turned OFF.

A voltage corresponding to reset/set/read operations (VRESET/VSET/VREAD) is applied to the bit line 3 (plate electrode). 0V is applied to the wire (word line WL) configured by the lower electrode 2.

It is possible to provide an electric voltage difference only to both ends of PCMCHAIN including SMC, by applying electric voltages to each electrode as described above. As a result, it is possible to select SMC only to operate the semiconductor storage device selectively.

Embodiment 3

Summary

As discussed thus far, the semiconductor storage device according to the embodiment 3 can, as in the embodiments 1-2, keep the channel length for keeping the withstand voltage between source/drain in OFF operation of the select transistor STTr., while decreasing the channel resistance in ON operation.

In addition, in the semiconductor storage device according to the embodiment 3, the number of the bit line 3 through which an electric current flows required for driving PCMCHAIN, especially for reset operation/set operations, is decreased from the embodiments 1-2. Thus it is possible to decrease the peripheral circuit area size for driving the bit line 3. Further, the semiconductor storage device according to the embodiment 3 achieves the projected area size $4F^2$ of the memory cell in the XY plane, while achieving the same effect as that of the embodiment 1. Thus it is advantageous in increasing the capacity and decreasing bit costs of the semiconductor storage device.

Embodiment 4

In the embodiments 1-3, PCMCHAIN is formed in the hole formed in the stacked body of cell gates and insulator films. One PCMCHAIN is formed in one hole. In an embodiment 4 of the present invention, a configuration example will be described where the stacked body of cell gates and insulator films is formed in stripe-shape extending in the Y direction, and where a pair of PCMCHAIN is formed in the groove between the stacked bodies.

Figure 11:
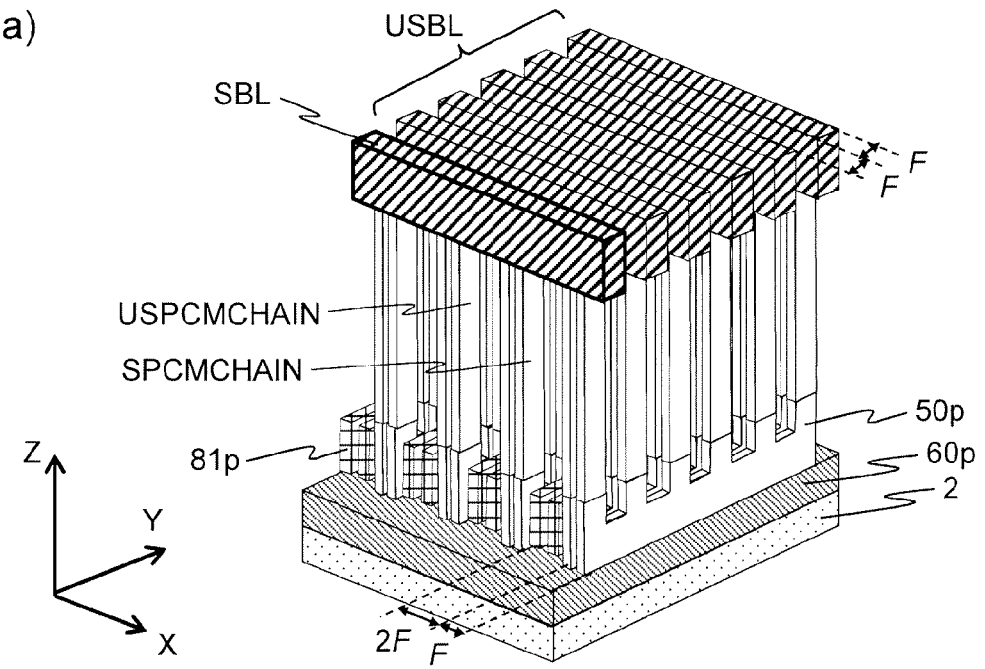
FIG. 11(a) is a schematic cubic diagram showing a configuration of a memory cell array portion of a semiconductor storage device according to an embodiment 4.
FIG. 11(b) is an XZ sectional diagram of the schematic cubic diagram of FIG. 11(a) according to the embodiment 4.
Figure 11:
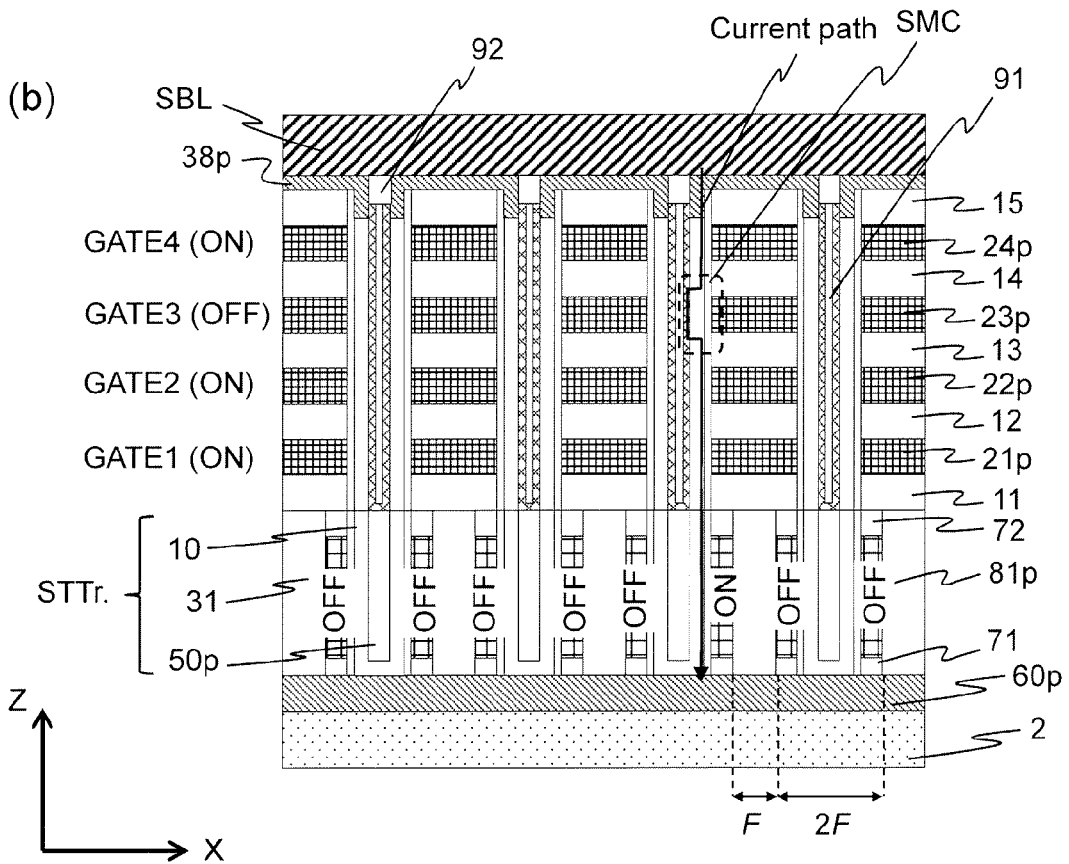

FIG. 11 is a diagram showing a configuration of a memory cell array portion of a semiconductor storage device according to the embodiment 4. FIG. 11(a) shows a schematic cubic diagram of a portion of the semiconductor storage device. FIG. 11(b) shows a XZ sectional diagram of FIG. 11(a). For the sake of simplicity, some portions such as cell gates or gate insulator films are omitted in the figure.

In FIG. 11, a groove extended in the Y direction is formed in the stacked body where cell gate electrodes 21p-24p and insulator films 11-15 are stacked alternately. A phase-change memory chain PCMCHAIN is formed in the groove. The select transistor STTr. is disposed below PCMCHAIN.

PCMCHAIN formed in the groove of the stacked body has a gate insulator film 9, a channel semiconductor layer 8p, a phase-change material layer 7, and an insulator film 91. PCMCHAINs are separated from each other in the Y direction by 2F pitch at the groove of the stacked body. The insulator film 91 disposed in the groove of the stacked body separates each PCMCHAIN in the X direction. Accordingly, a pair of PCMCHAIN is formed opposing to each other in the X direction within each PCMCHAIN.

The channel semiconductor layer 50p of STTr. is continuous in the Y direction as in the embodiments 1-3. A recess is formed in the channel semiconductor layer 50p in order to suppress the leak current between SPCMCHAIN and USPCMCHAIN adjacent to each other in the Y direction, as in the embodiments 1-3.

In FIG. 11, the bit line 3 extending in the X direction may be formed by 2F pitch, and the gate electrode 81p of the select transistor STTr. extending in the Y direction may be formed by 3F pitch, where F is the minimum feature size. Thus a unit structure can be formed with projected area size $6F^2$ in the XY plane. A pair of PCMCHAINs separated by the insulator film 91 is formed within the unit structure. Thus the projected area size of PCMCHAIN in the XY plane is $3F^2$.

Figure 12:
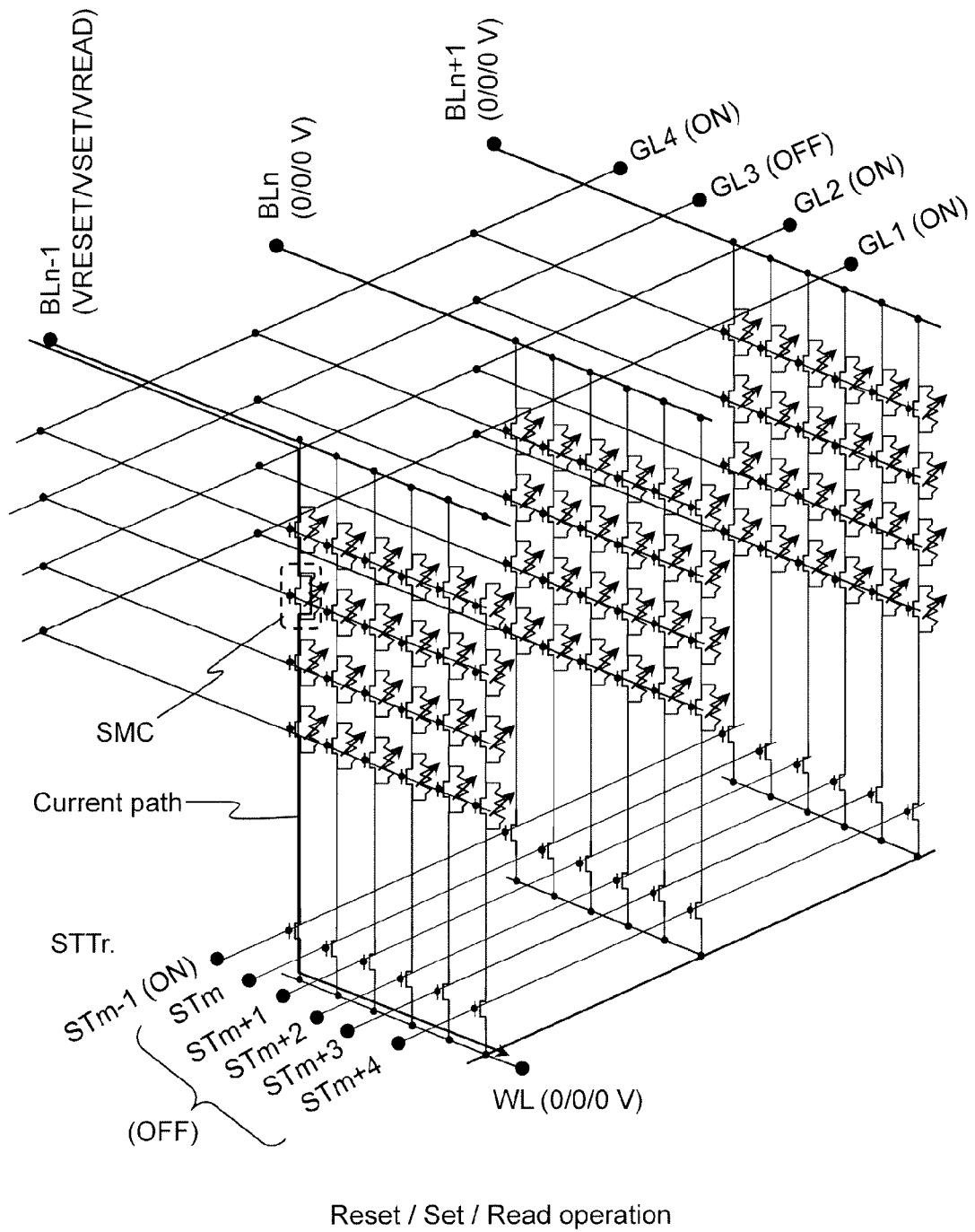
FIG. 12 is an equivalent circuit diagram of the semiconductor storage device of FIG. 11(a).

FIG. 12 is an equivalent circuit diagram of the semiconductor storage device of FIG. 11. Voltage conditions for read operation/set operation/reset operation are also described in the figure. The method for selecting cells in PCMCHAIN and the method for reading/writing information with respect to memory cells are the same as those of the embodiments 1-3. The method for selecting PCMCHAIN the same as that of the embodiment 1.

Embodiment 4

Summary

As discussed thus far, the semiconductor storage device according to the embodiment 4 can, as in the embodiments 1-3, keep the channel length for keeping the withstand voltage between source/drain in OFF operation of the select transistor STTr., while decreasing the channel resistance in ON operation.

In addition, the semiconductor storage device according to the embodiment 4 achieves the projected area size $3F^2$ of the memory cell in the XY plane, while achieving the same effect as that of the embodiment 1. Thus it is advantageous in increasing the capacity and decreasing bit costs of the semiconductor storage device.

Embodiment 5

In the semiconductor storage device of the embodiment 4, the pitch between memory cells in the X direction is 3F. Thus together with the pitch 2F in the Y direction, the projected area size of the unit structure in the XY plane is $6F^2$. Since there are two PCMCHAINs in the unit structure, the projected area size of one PCMCHAIN in the XY plane is $3F^2$. In an embodiment 5 of the present invention, a configuration example will be described where the pitch between memory cells in the X direction is 2F, thereby achieving the projected area size of PCMCHAIN in the XY plane of $2F^2$.

Figure 13:
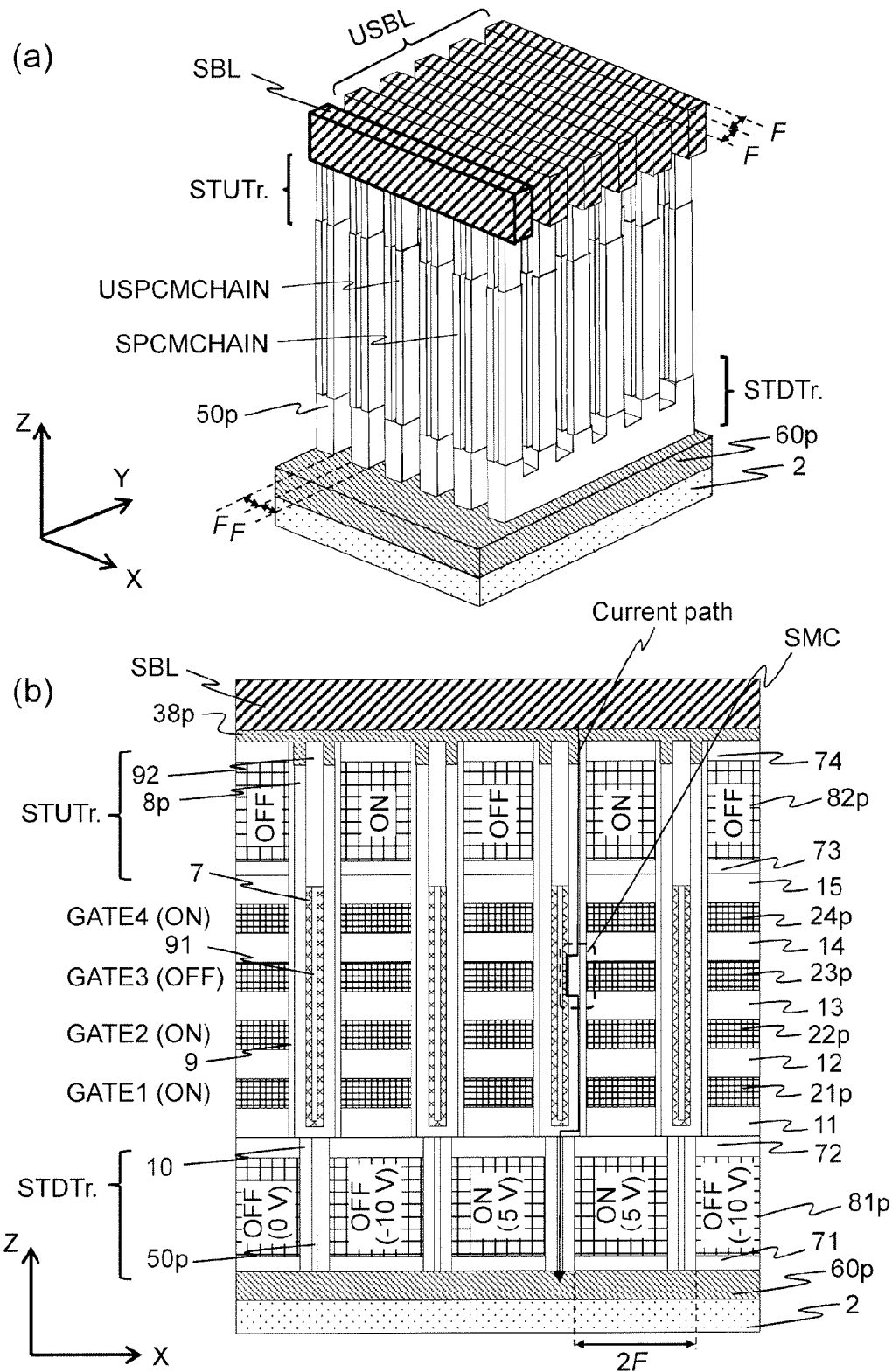
FIG. 13(a) is a schematic cubic diagram showing a configuration of a memory cell array portion of a semiconductor storage device according to an embodiment 5.
FIG. 13(b) is an XZ sectional diagram of the schematic cubic diagram of FIG. 13(a) according to the embodiment 5.

FIG. 13 is a diagram showing a configuration of a memory cell array portion of a semiconductor storage device according to the embodiment 5. FIG. 13(a) shows s schematic cubic diagram of a portion of the semiconductor storage device. FIG. 13(b) shows a XZ sectional diagram of FIG. 13(a). For the sake of simplicity, some portions such as cell gates or gate insulator films are omitted in the figure.

The difference from FIG. 11 of the embodiment 4 is that the select transistor is formed by two stages of lower STDTr. and upper STUTr. Another difference is that the gate electrode 81p of the lower select transistor STDTr. does not have a groove for separating in the X direction, i.e. a space with size F where the insulator film 31 is embedded. Thus in the STDTr. of the semiconductor storage device shown in FIG. 13, the channel semiconductor layer 50p is formed at both sides of the gate electrode 81p in the X direction through the gate insulator film 10. With this configuration, the pitch of STDTr. in the X direction and the pitch of PCMCHAIN connected above STDTr. may be both 2F. Note that as in FIG. 6 of the embodiment 2, when ON voltage is applied to one of the gate electrode 81p, the channel semiconductor layers 50p at both sides of the gate electrode 81p are turned ON.

The channel semiconductor layer 50p of STDTr. in the embodiment 5 is continuous in the Y direction as STTr. in the embodiment 4. A recess is formed at the upper surface of the channel semiconductor layer 50p as in the embodiments 1-4. Accordingly, the leak current between SPCMCHAIN and USPCMCHAIN adjacent to each other in the Y direction is suppressed.

As in FIG. 6 of the embodiment 2, ON voltage is applied to the gate electrode 81p at both sides of the channel semiconductor layer 50p that is to be turned ON. OFF voltage is applied to the gate electrode 81p at both sides of the channel semiconductor layer 50p that is to be turned OFF. In order to turn OFF the channel semiconductor layer 50p contacting with the gate 81p at one side to which ON voltage is applied, OFF voltage stronger than usual is applied to another one of the gate electrode 81p of the channel semiconductor layer 50p. Accordingly, only one of the channel semiconductor layers 50p aligned in the X direction may be selectively turned ON.

In the configuration shown in FIG. 13, one pair of PCMCHAINs is connected to one channel semiconductor layer 50p. Therefore, an additional selection device is necessary for distinguishing and selecting those two PCMCHAINs. Thus in the embodiment 5, one of PCMCHAINs is selected using the upper STUTr.

The gate electrode 82p of STUTr. is formed by 2F pitch extending in the Y direction. A channel semiconductor layer 8p is formed at both sides of the gate electrode 82p in the X direction. The channel semiconductor layer 8p is in the same layer as the channel semiconductor layer 8p of the cell transistor of PCMCHAIN, and thus is electrically connected with each other. Two of the channel semiconductor layer 8p is formed between the gate electrodes 82p adjacent to each other in the X direction, and is connected with two PCMCHAINs. The channel semiconductor layer 8p of STUTr. is not continuous in the Y direction and thus is separated.

The gate electrode 82p is electrically bound alternately, and can be supplied with electric power from peripheral circuits. It is possible to electrically connect only one of two PCMCHAINs with the bit line by applying ON voltage to one of the gate electrodes 82p of two STUTr. and by applying OFF voltage to another one of the gate electrode 82p.

Instead of the channel semiconductor layer 8p of STUTr, it is conceivable to separate the channel semiconductor layer 50p of STDTr. in the Y direction. In such case, however, it is impossible to keep the channel length for keeping the withstand voltage between source/drain of STDTr. in OFF operation. In other words, it is necessary to form the recess for keeping the channel length between adjacent PCMCHAINs on the channel semiconductor layer of the select transistor for selecting PCMCHAIN.

Figure 14:
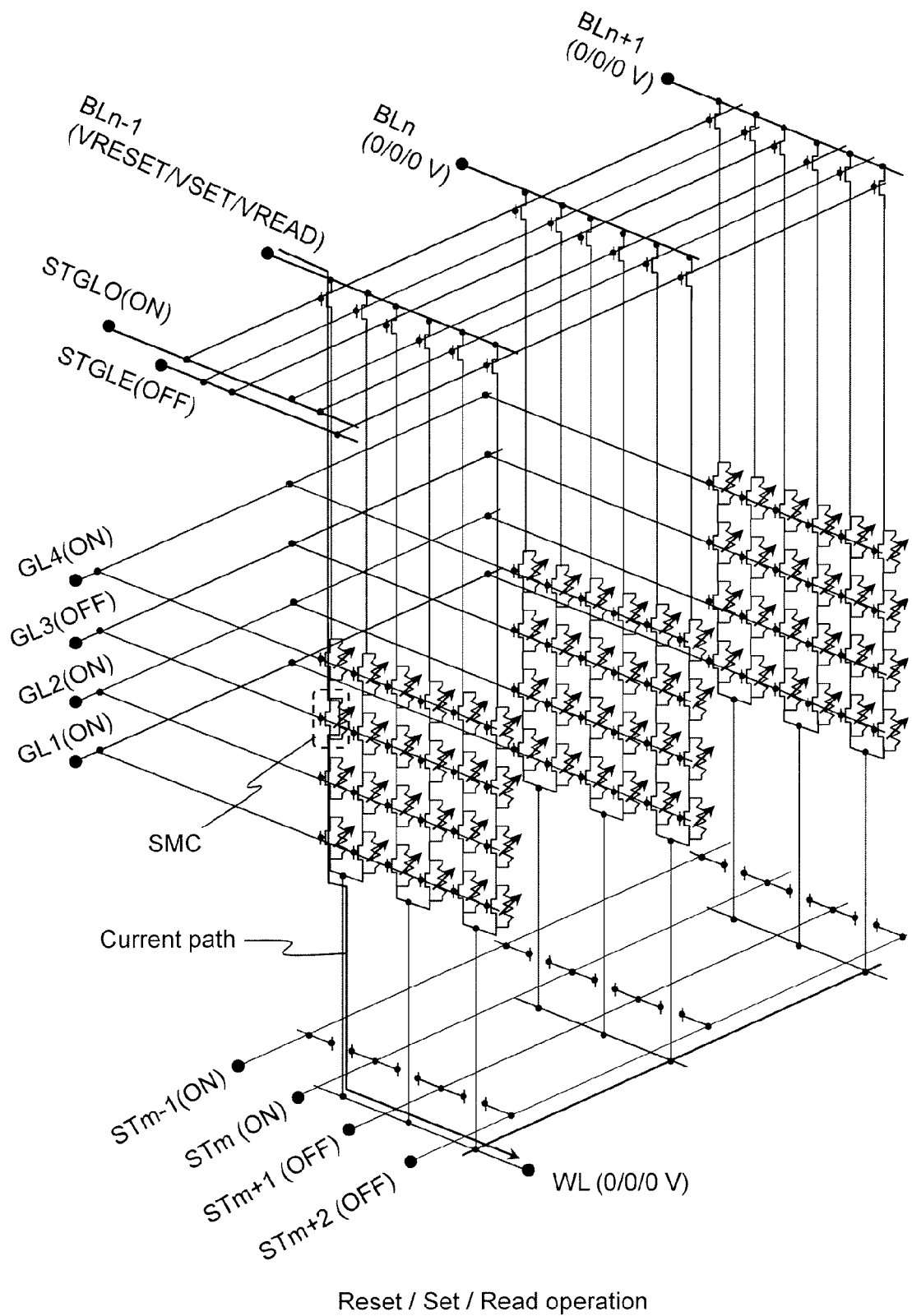
FIG. 14 is an equivalent circuit diagram of the semiconductor storage device of FIG. 13(a).

FIG. 14 is an equivalent circuit diagram of the semiconductor storage device of FIG. 13. Voltage conditions for read operation/set operation/reset operation are also described in the figure. The method for selecting cells in PCMCHAIN and the method for reading/writing information with respect to memory cells are the same as those of the embodiments 1-4. Thus the method for selecting PCMCHAIN will be described. In the embodiment 5, both of STDTr. and STUTr. are used when selecting PCMCHAIN.

ON voltage is applied to two gate electrodes 81p of STDTr. connected with PCMCHAIN including SMC. OFF voltage is applied to the gate electrode 81p of other STDTr. OFF voltage stronger than usual is applied to the gate electrode 81p that is connected with the gate electrode 81p of STDTr. to which ON voltage is applied and that is another one of the gate electrode 81p of STDTr. to be turned OFF. ON voltage is applied to the gate electrode 8p of STUTr. connected with PCMCHAIN including SCM. OFF voltage is applied to the gate electrodes 8p of other STUTr. By applying voltages to each electrode as above, it is possible to electrically connect between the lower electrode 2 (word line WL) and the upper electrode 3 (bit line BL) only for PCMCHAIN including SMC.

Embodiment 5

Summary

As discussed thus far, the semiconductor storage device according to the embodiment 5 can, as in the embodiments 1-3, keep the channel length for keeping the withstand voltage between source/drain in OFF operation of the select transistor STTr., while decreasing the channel resistance in ON operation.

In the semiconductor storage device according to the embodiment 5, the channel semiconductor layer 8p of STUTr. is separated in the Y direction. Thus its ON resistance is large, decreasing the number of cells that can be stacked in PCMCHAIN depending on the ON resistance. However, the projected area size of PCMCHAIN in the XY plane is decreased to $2F^2$, which is beneficial for densification in the semiconductor substrate plane.

Embodiment 6

In the semiconductor storage device of the embodiment 5, multiple of the wire configured by the upper electrode 3 is formed by 2F pitch extending in the X direction. In an embodiment 6 of the present invention, a configuration example will be described where the upper electrode 3 is also formed in plate-like shape as that of the lower electrode 2. The semiconductor storage device according to the embodiment 6 can configure the pitch between memory cells at 2F both in the X and Y directions, thereby configuring the projected area size of the unit structure at $4F^2$ in the XY plane. In addition, as in the semiconductor storage device according to the embodiments 4-5, two PCMCHAINs are formed in the unit structure. Thus it is possible to configure the projected area size of PCMCHAIN at $2F^2$ in the XY plane.

Figure 15:
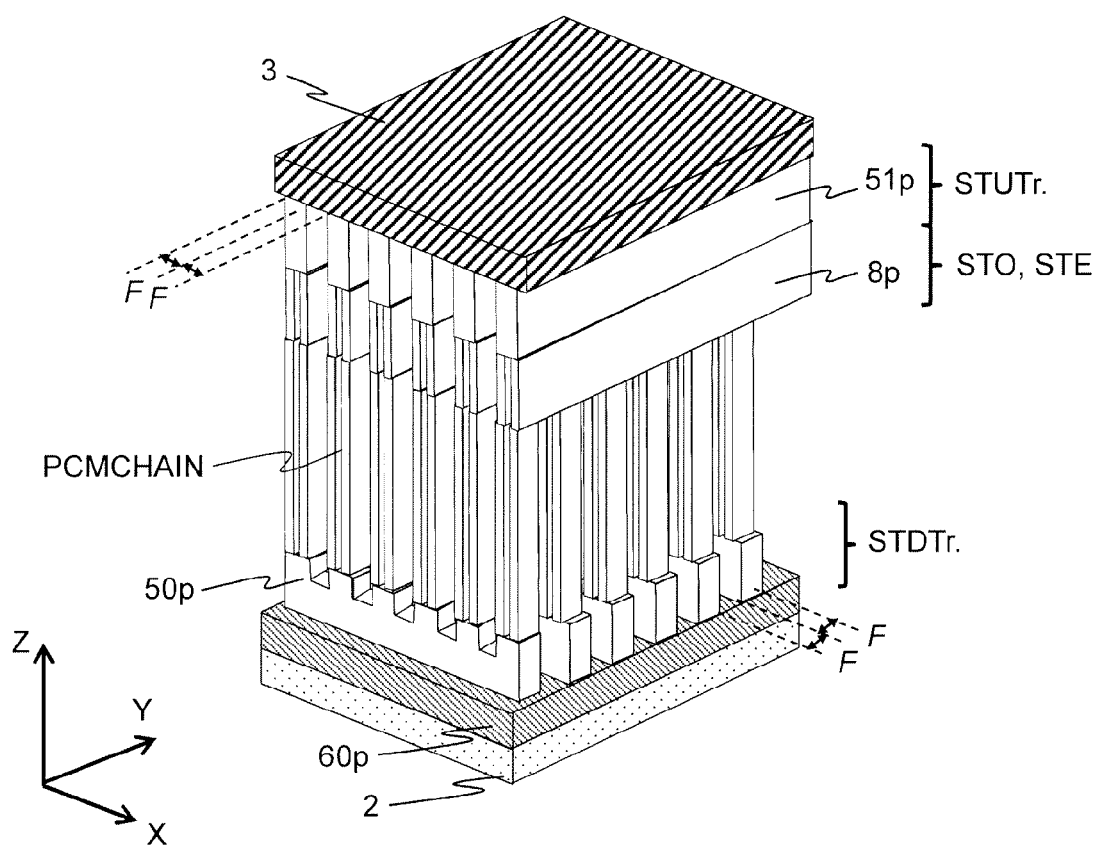
FIG. 15 is a schematic cubic diagram of a portion of a memory cell array portion of a semiconductor storage device according to an embodiment 6.

FIG. 15 is a schematic cubic diagram of a portion of a memory cell array portion of a semiconductor storage device according to the embodiment 6. For the sake of simplicity, some portions such as cell gates or gate insulator films are omitted in the figure. The difference from FIG. 14 of the embodiment 5 is that: the bit line 3 is in plate-like shape; the upper select transistor is formed by two stages of (STO, STE) and STUTr.; the gate electrodes of STDTr. is perpendicular to the gate electrode of the upper select transistor.

STDTr. has a gate electrode (omitted in FIG. 15) extending in the X direction and the channel semiconductor layer 50p extending in the X direction. A recess is formed at the top of the channel semiconductor layer 50p in order to suppress the leak current between the selected chain and the non-selected chain, as in the embodiments 1-5. It is not necessary to form the recess in the channel semiconductor layer 51p of STUTr. The reason for it is the same as that regarding the sneak path in the embodiment 3.

Figure 16:
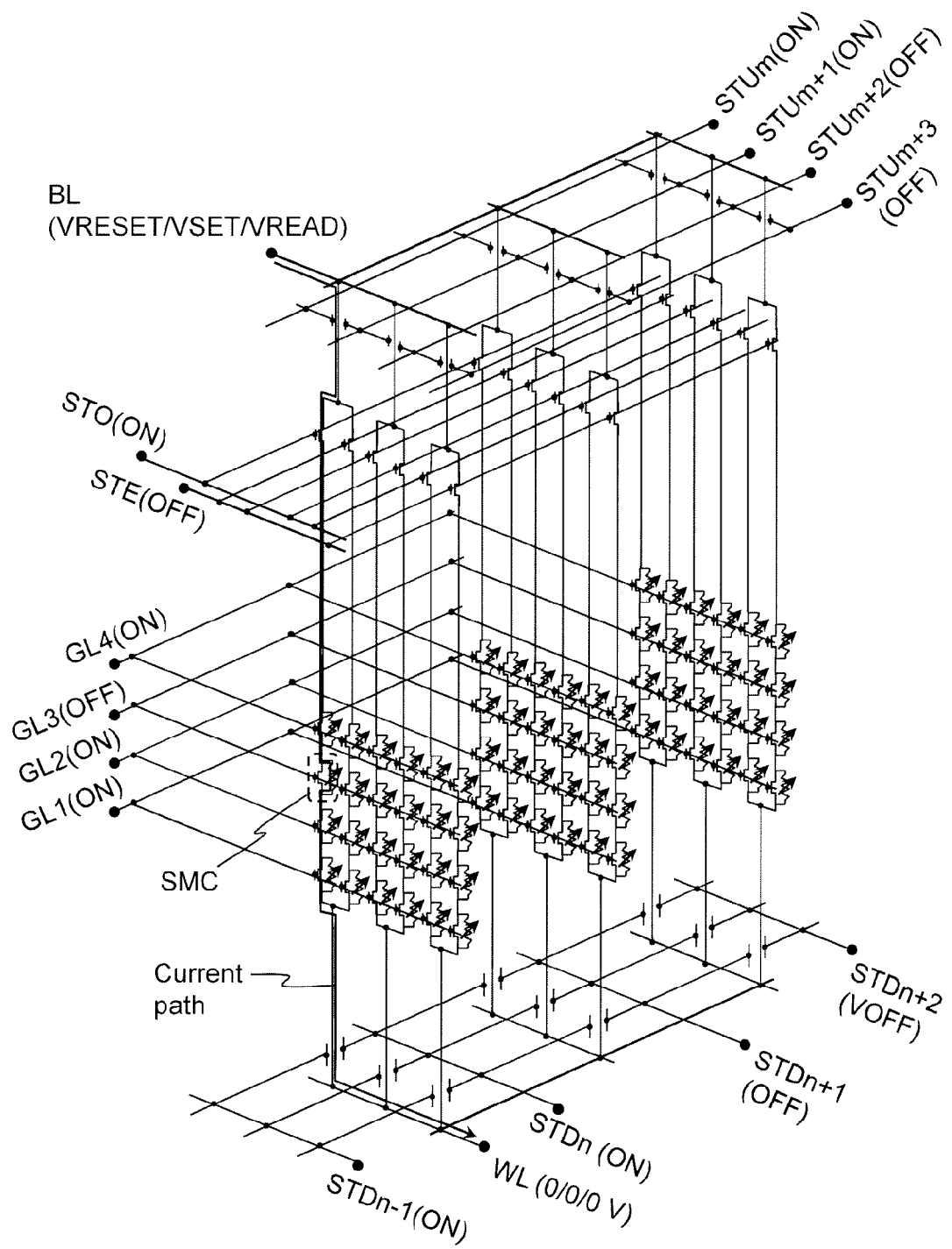
FIG. 16 is an equivalent circuit diagram of the semiconductor storage device of FIG. 15.

FIG. 16 is an equivalent circuit diagram of the semiconductor storage device of FIG. 15. Voltage conditions for read operation/set operation/reset operation are also described in the figure. The method for selecting cells in PCMCHAIN and the method for reading/writing information with respect to memory cells are the same as those of the embodiments 1-5. Thus the method for selecting PCMCHAIN will be described. In the embodiment 6, both of STDTr. and STUTr. are used when selecting PCMCHAIN.

ON voltage is applied to the gate electrode 81p of STDTr. connected with PCMCHAIN including SMC. OFF voltage is applied to the gate electrodes 81p of other STDTr. OFF voltage stronger than usual is applied to the gate electrode 81p that is connected with the gate electrode 81p of STDTr. to which ON voltage is applied and that is of STDTr. to be turned OFF.

ON voltage is applied to two gate electrodes 8p of STUTr. connected with PCMCHAIN including SMC. OFF voltage is applied to the gate electrode 8p of other STUTr. Strong OFF voltage is applied to the gate electrode 8p that is connected with the gate electrode 8p of STUTr. to which ON voltage is applied and that is another one of the gate electrode 8p of STUTr. to be turned OFF.

Among STO and STE, ON voltage is applied to the one connected with PCMCHAIN including SMC, and OFF voltage is applied to the another one. A voltage corresponding to reset/set/read operations (VRESET/VSET/VREAD) is applied to the bit line 3 (plate electrode). 0V is applied to the wire (word line WL) configured by the lower electrode 2.

By applying voltages to each electrode as above, it is possible to provide a voltage difference only to both ends of PCMCHAIN including SMC. As a result, it is possible to select SMC only, thereby operating the semiconductor storage device selectively.

Embodiment 6

Summary

As discussed thus far, in the semiconductor storage device according to the embodiment 6, the number of the bit line 3 through which the electric current flows that is required for driving PCMCHAIN, especially for reset operation/set operation, is decreased from the embodiments 4-5. Thus it is possible to reduce the peripheral circuit area size for driving the bit line 3. In addition, the projected area size of PCMCHAIN in the XY plane is $2F^2$, which is advantageous for densification in the semiconductor substrate plane.

In addition, comparing with the semiconductor storage device of the embodiment 5, all channel semiconductor layers of the select transistor are shared between adjacent PCMCHAINs. Thus it is possible to keep channel length for keeping the withstand voltage between source/drain in OFF operation of the select transistor, while reducing the channel resistance in ON operation. Accordingly, it is possible to increase the number of cells that can be stacked in PCMCHAIN. As a result, it is possible to achieve increasing the capacity and decreasing bit costs of the semiconductor storage device of the embodiment 6.

Embodiment 7

In the semiconductor storage device of the embodiments 5-6, the select transistor is formed by multiple stages in order to form PCMCHAIN with projected area size of $2F^2$ in the XY plane and to selectively operate the device. In an embodiment 7 of the present invention, a configuration example will be described where PCMCHAIN is formed with projected area size of $2F^2$ in the XY plane and is operated selectively, by using one stage of the select transistor.

Figure 17:
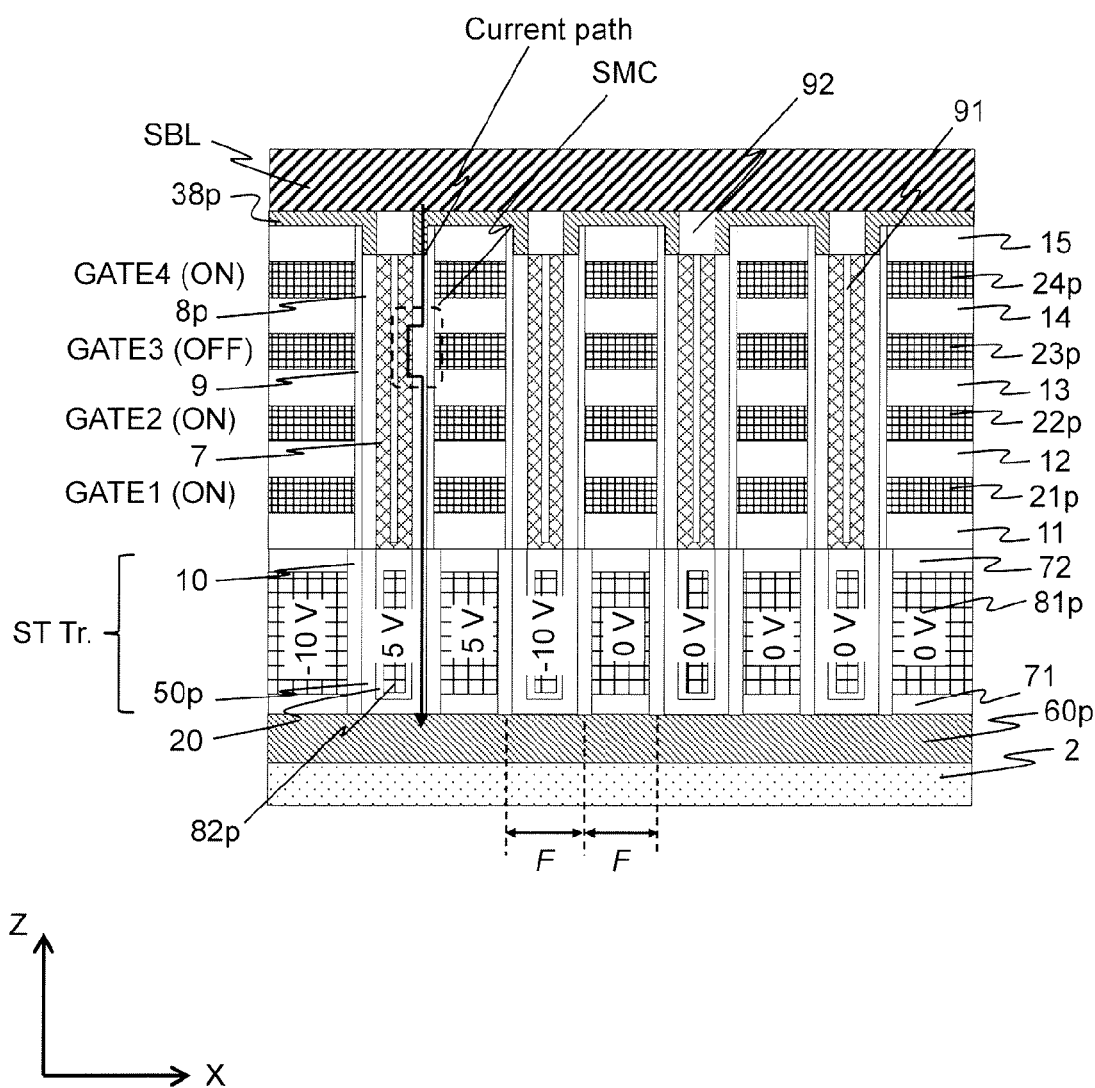
FIG. 17 is a sectional diagram of a portion of a memory cell array portion of a semiconductor storage device according to an embodiment 7.

FIG. 17 is a sectional diagram of a portion of a memory cell array portion of a semiconductor storage device according to the embodiment 7. The difference from the semiconductor storage device of the embodiment 5 is that: the select transistor is formed by one stage; the gate of the select transistor STTr. is formed by pitch F. The channel semiconductor layer 50*p* of the select transistor STTr. is connected with only one PCMCHAIN in the X direction. Although not shown in FIG. 17, the channel semiconductor layer 50*p* is continuous in the Y direction, and a recess is formed at the top of it as in the embodiments 1-6.

Figure 18:
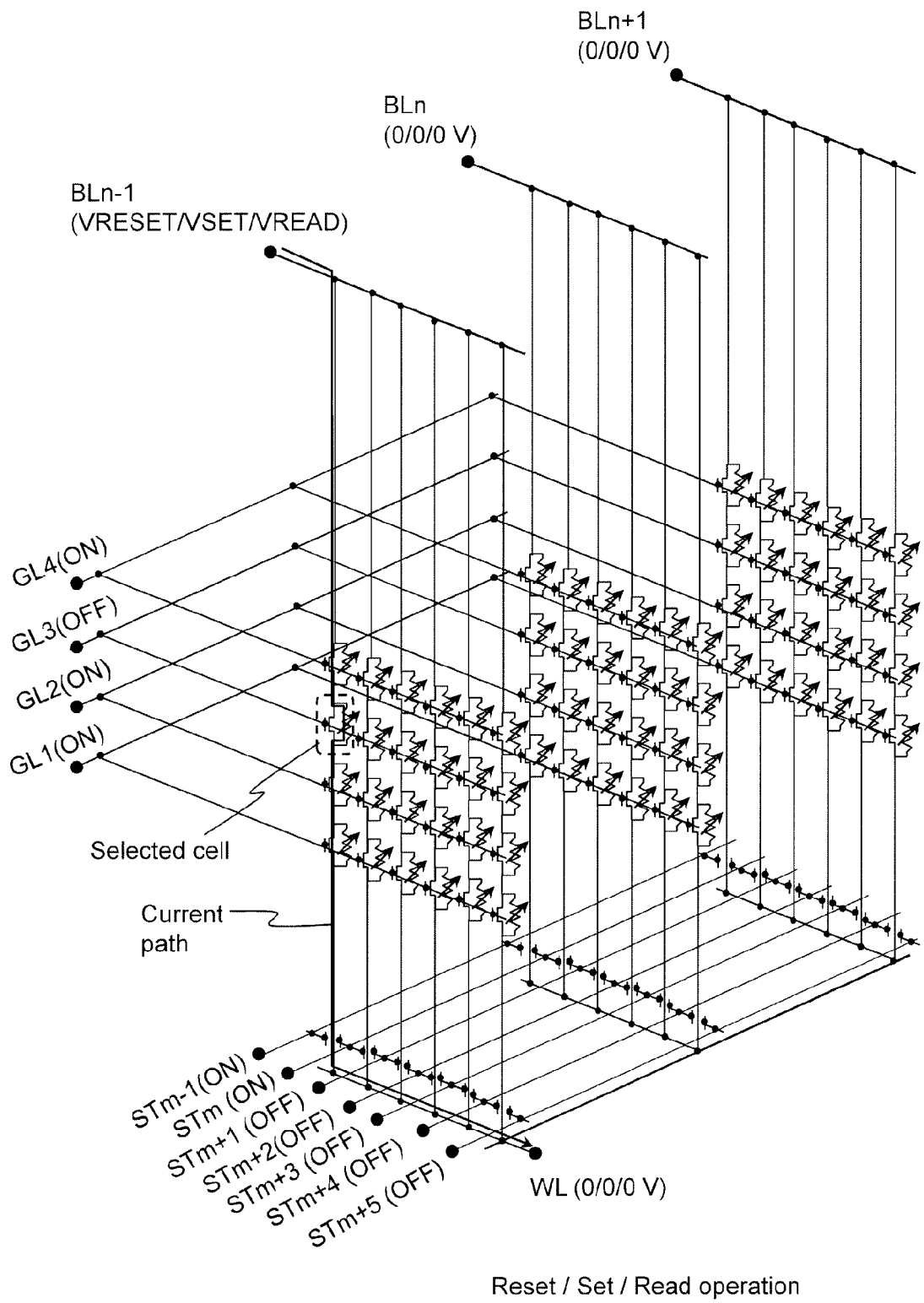
FIG. 18 is an equivalent circuit diagram of the semiconductor storage device of FIG. 17.

FIG. 18 is an equivalent circuit diagram of the semiconductor storage device of FIG. 17. Voltage conditions for read operation/set operation/reset operation are also described in the figure. The method for selecting cells in PCMCHAIN and the method for reading/writing information with respect to memory cells are the same as those of the embodiments 1-6. Thus the method for selecting PCMCHAIN will be described. In the embodiment 7, STTr. is used when selecting PCMCHAIN.

ON voltage is applied to two gate electrodes (one is 81*p* and another is 82*p*) of STTr. connected with PCMCHAIN including SMC. OFF voltage is applied to the gate electrode of other STTr. OFF voltage stronger than usual (e.g. −10V) is applied to the gate electrode that is connected with the gate electrode of STTr. to which ON voltage is applied and that is another one of the gate electrode of STTr. to be turned OFF.

A voltage corresponding to reset/set/read operations (VRESET/VSET/VREAD) is applied to the bit line 3 (SBL) connected with PCMCHAIN including SMC. 0V is applied to other ones of the bit line (USBL) and to the wire (word line WL) configured by the upper electrode 2.

By applying voltages to each electrode as described above, it is possible to provide a voltage difference only to both ends of PCMCHAIN including SMC. As a result, it is possible to select SMC only, thereby operating the semiconductor storage device selectively.

Embodiment 7

Summary

As discussed thus far, in the semiconductor storage device of the embodiment 7, the projected area size of PCMCHAIN in the XY plane is $2F^2$, which is advantageous for densification in the semiconductor substrate plane. In addition, the channel semiconductor layer 50*p* of STTr. is shared between adjacent PCMCHAINs. Thus it is possible to keep channel length for keeping the withstand voltage between source/drain in OFF operation of the select transistor, while reducing the channel resistance in ON operation, as in the embodiments 1-6. Accordingly, it is possible to increase the number of cells that can be stacked in PCMCHAIN. As a result, it is possible to achieve increasing the capacity and decreasing bit costs of the semiconductor storage device of the embodiment 7.

Embodiment 8

In order to further increase the capacity of the semiconductor storage device of the embodiments 1-7, PCMCHAIN may be further stacked. In an embodiment 8 of the present invention, a configuration example will be described where PCMCHAIN arrays are stacked.

Figure 19:
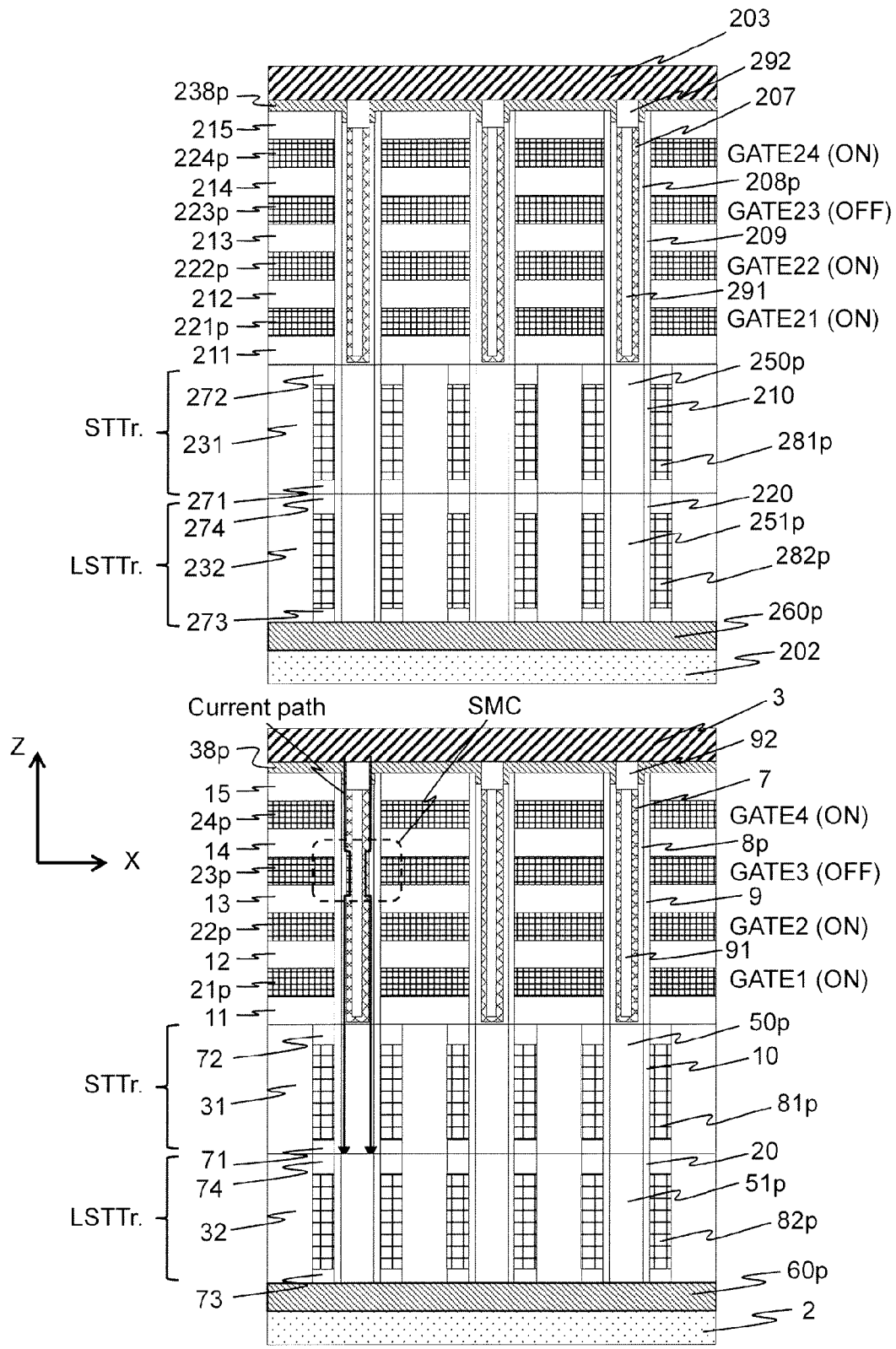
FIG. 19 is a sectional diagram of a portion of a memory cell array portion of a semiconductor storage device according to an embodiment 8.

FIG. 19 is a sectional diagram of a portion of a memory cell array portion of a semiconductor storage device according to the embodiment 8. A structure is exemplified where a layer select transistor LSTTr. is formed below PCMCHAIN array of the semiconductor storage device described in the embodiment 1, and two layers of that structure are further stacked. Each of the stacked structures has the same configuration. For the sake of identifying them, reference numbers of 200th are assigned to the upper stacked body.

Figure 20:
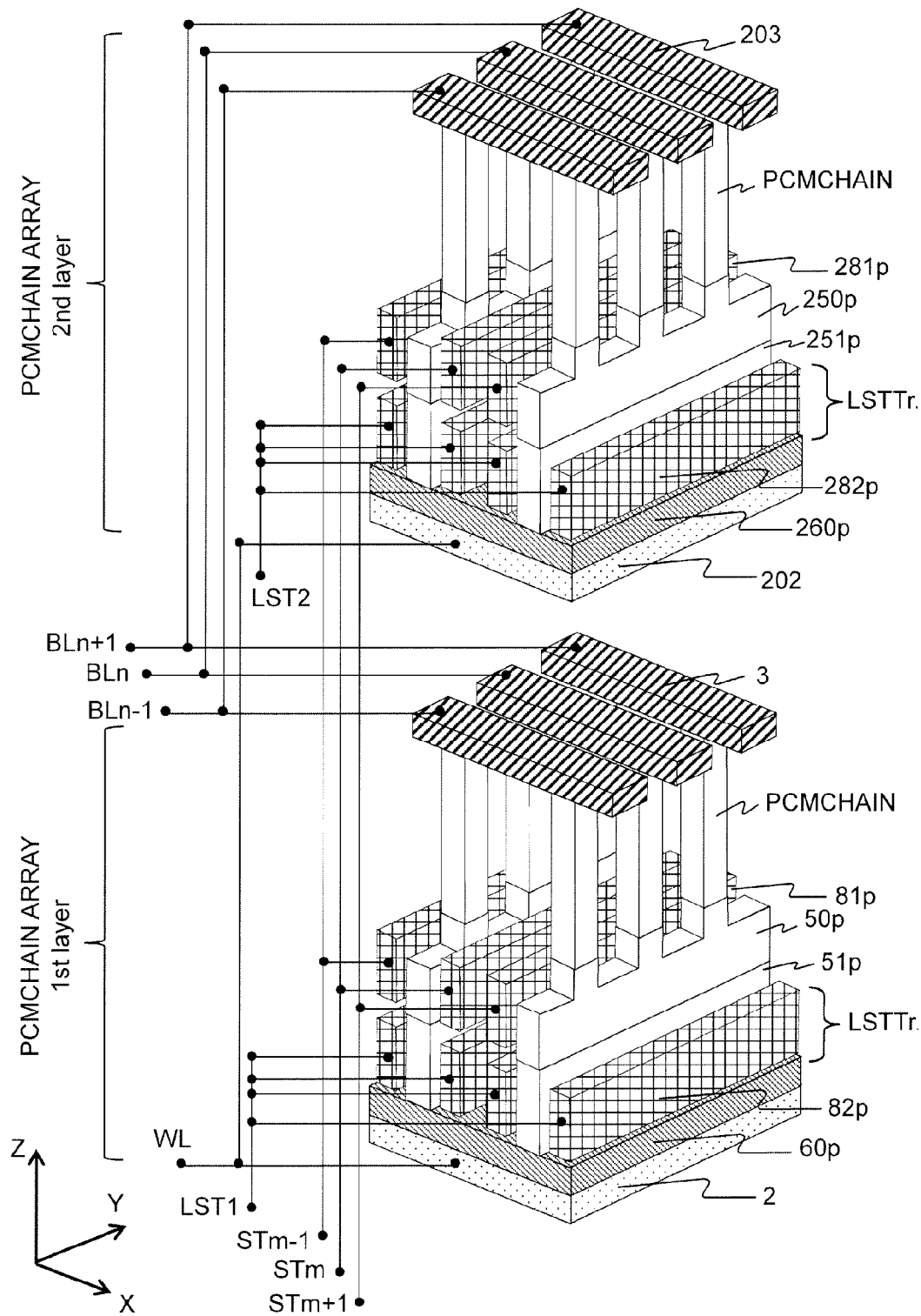
FIG. 20 is a schematic cubic diagram of the semiconductor storage device shown in FIG. 19.

FIG. 20 is a schematic cubic diagram of the semiconductor storage device shown in FIG. 19. For the sake of simplicity, some portions such as cell gates or gate insulator films are omitted in the figure. The channel semiconductor layer 51*p* of LSTTr. is extended in the Y direction as the gate electrode 82*p* is. One of the channel semiconductor layer 50*p* of STTr. and one of the channel semiconductor layer 51*p* of LSTTr. are connected with each other.

Figure 21:
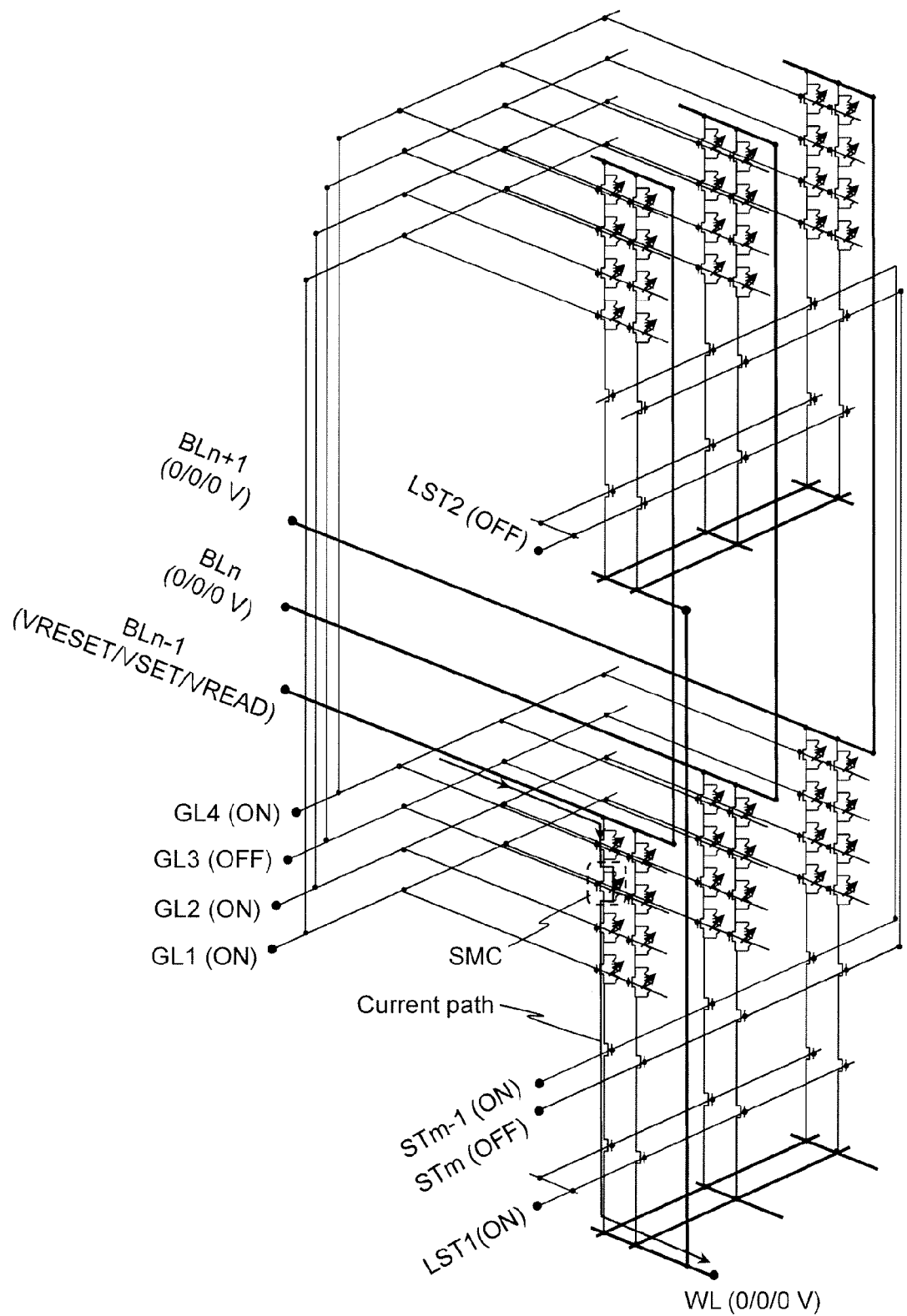
FIG. 21 is an equivalent circuit diagram of the semiconductor storage device of FIG. 20.

FIG. 21 is an equivalent circuit diagram of the semiconductor storage device of FIG. 20. Voltage conditions for read operation/set operation/reset operation are also described in the figure. By adding LSTTr. to stack PCMCHAIN arrays, at least one of the bit line 3/the word line 2/the cell gate/the select transistor gate can be shared between each of multiply stacked PCMCHAINs, as shown in the equivalent circuit diagram of FIG. 21. Accordingly, increase in peripheral circuit area size required for driving the bit line 3/the word line 2/the cell gate/the select transistor gate can be suppressed, thereby promoting low bit costs.

Patent Literature 2 discloses a technique using the layer select transistor LSTTr. However, the channel semiconductor layer of the layer select transistor LSTTr. is separated for each of PCMCHAINs. Thus the number of stacks in each PCMCHAIN is decreased due to ON resistance of the layer select transistor LSTTr. In the semiconductor storage device of the embodiment 8, the channel semiconductor layer 51*p* of the layer select transistor LSTTr. is connected in the Y direction, thus the ON resistance is reduced. In addition, it is possible to couple all of the gate electrodes of LSTTr. in each layer. In addition, the leak current between PCMCHAINs is suppressed by the recess formed in the channel semiconductor layer 50*p* of STTr. Thus it is not necessary to form a recess in the channel semiconductor layer 51*p* of LSTTr.

When the memory cell operates, ON voltage is applied to the gate (LST1 in FIG. 21) of the layer select transistor LSTTr. of PCMCHAIN array including SMC. OFF voltage is applied to the gate (LST2 in FIG. 21) of LSTTr. of other ones of the layer select transistor LSTTr. The method for selecting PCMCHAIN and the method for selecting memory cells in it are the same as those of the embodiment 1.

Figure 22:
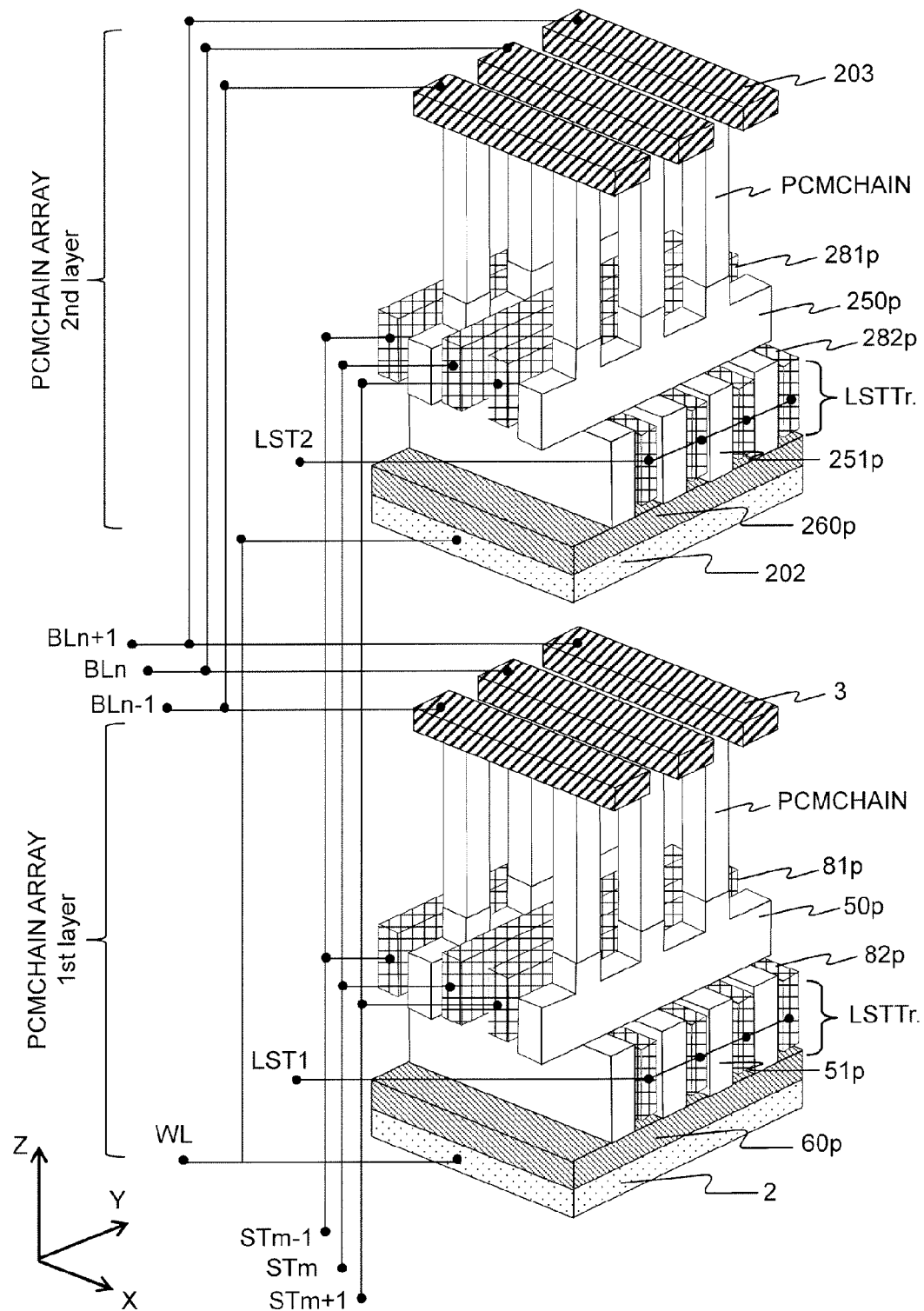
FIG. 22 is a diagram showing modifications of FIGS. 19-21.

FIG. 22 is a diagram showing modifications of FIGS. 19-21. In FIGS. 19-21, the gate electrode 82*p* and the channel semiconductor layer 51*p* of the layer select transistor LSTTr. are formed by patterns extending into the Y direction in parallel with STTr. They may be formed by patterns extending into the X direction perpendicular to STTr. Since the role of LSTTr. is switching ON/OFF between the lower electrode 2 and STTr., the same functionality may be provided even if LSTTr. is perpendicular to STTr. as shown in FIG. 22. In LSTTr. of FIG. 22, it is also possible to reduce the ON resistance by connecting the channel semiconductor layer 51*p* in the X direction.

In FIGS. 19-21, LSTTr. is added to PCMCHAIN of the semiconductor storage device of the embodiment 1, thereby stacking PCMCHAIN. LSTTr. may be added to the structures of the embodiments 2-7 to stack PCMCHAIN arrays. In such cases, at least one of the bit line 3/the word line 2/the cell gate/the select transistor gate may be shared between multiply stacked PCMCHAIN arrays. Thus increase in peripheral circuit area size required for driving the bit line 3/the word line 2/the cell gate/the select transistor gate can be restricted, thereby promoting low bit costs. In addition, the channel semiconductor layer 51*p* of the layer select transistor LSTTr. may be extended in the X or Y directions, thus the ON resistance can be reduced.

Embodiment 8

Summary

As discussed thus far, in the semiconductor storage device according to the embodiment 8, the bit line, the word line, the cell gate, and the select transistor gate may be shared between each layer of multiply stacked PCMCHAIN arrays. Thus increase in peripheral circuit area size required for driving the bit line, the word line, the cell gate, and the select transistor gate can be restricted, thereby promoting low bit costs. Since the channel of the layer select transistor may be shared to reduce the ON resistance, it is possible to suppress decrease in the number of stacked cells in PCMCHAIN even if the layer select transistor is added. Accordingly, the semiconductor storage device according to the embodiment 8 may achieve increasing the capacity and decreasing bit costs of the semiconductor storage device.

The present invention is not limited to the embodiments, and various modified examples are included. The embodiments are described in detail to describe the present invention in an easily understood manner, and the embodiments are not necessarily limited to the embodiments that include all configurations described above. Part of the configuration of an embodiment can be replaced by the configuration of another embodiment. The configuration of an embodiment can be added to the configuration of another embodiment. Addition, deletion, and replacement of other configurations are also possible for part of the configurations of the embodiments.

REFERENCE SIGNS LIST

2, 202: selection electrode
3, 203: lower electrode
21*p*, 22*p*, 23*p*, 24*p*: gate polysilicon layer
81*p*, 82*p*: gate electrode
7, 207; phase-change material layer
8*p*, 50*p*, 51*p*, 208*p*, 250*p*, 251*p*: channel semiconductor layer
9, 10, 20, 209, 210, 220: gate insulator film layer
60*p*, 61*p*, 62*p*, 260*p*, 38*p*, 238*p*: N-type semiconductor layer
11, 12, 13, 14, 15, 71, 72, 73, 74: insulator film layer
211, 212, 213, 214, 215, 271, 272, 273, 274: insulator film layer
31, 32, 91, 92, 231, 232, 291, 292: insulator film layer
PCMCHAIN: phase-change memory chain
SPCMCHAIN: selected phase-change chain
USPCMCHAIN: non-selected phase-change chain
STTr.: select transistor
STUTr.: upper select transistor
STDTr.: lower select transistor
STO, STE: select transistor
LSTTr. layer select transistor
LST1, LST2: gate electrode of layer select transistor
GATE1, GATE2, GATE3, GATE4: gate electrode of transistor
GATE21, GATE22, GATE23, GATE24: gate electrode of transistor
GL1, GL2, GL3, GL4: terminal for supplying power to gate
STm−2, STm−1, STm, STm+1, STm+2, STm+3, STm+4, STm+5: select transistor gate
BL, BLn−1, BLn, BLn+1, BLn+2: bit line
SBL: selected bit line
USBL: non-selected bit line
SMC: selected memory cell
WL: word line
VREAD: read voltage
VSET: set voltage
VRESET: reset voltage
Tsi: channel silicon film thickness

The invention claimed is:

1. A semiconductor storage device comprising:
   a plurality of first select transistors, the first select transistor disposed above a lower electrode, and the first select transistor extended in a first direction;
   a plurality of memory cell arrays disposed in the first direction, the memory cell array including one or more memory cells connected in series in a normal direction of the lower electrode; and
   a selector that selects one of the plurality of memory cell arrays along the first direction;
   wherein an end of the memory cell array in the normal direction is electrically connected with the first select transistor, and another end of the memory cell array is electrically connected with the selector,
   wherein a plurality of the first select transistor is disposed along a second direction that is perpendicular to the first direction in a plane of the lower electrode, and wherein a channel of each of the first select transistor is electrically connected with each of the memory cell arrays adjacent to each other along the first direction.

2. The semiconductor storage device according to claim 1, wherein a recess is formed by caving the channel in the normal direction at a portion between the memory cell arrays adjacent to each other in the first direction.

3. The semiconductor storage device according to claim 2, wherein a depth of the recess is at or more than a distance calculated by subtracting, from half of a minimum distance that can keep a withstand voltage between source/drain of the first select transistor, half of an interval between the memory cell arrays adjacent to each other in the first direction.

4. The semiconductor storage device according to claim 1, wherein the selector is configured as a plurality of selection lines disposed in the first direction, the selection line extending in the second direction,
and wherein the another end of the memory cell array is directly connected with the selection line which is disposed above the memory cell array.

5. The semiconductor storage device according to claim 1, the semiconductor storage device comprising a voltage application circuit that applies an electric voltage to a gate electrode of the first select transistor,
wherein the gate electrode of the first select transistor is connected with, through a gate insulator film, each of channels of each of the first select transistors adjacent to each other in the second direction,
wherein the voltage application circuit applies a predetermined ON voltage that turns ON the first select transistor to the gate electrode connected with a channel of the first select transistor to be turned ON,
wherein the voltage application circuit applies a second OFF voltage smaller than a predetermined OFF voltage that turns OFF the first select transistor to the gate electrode connected with the channel at another side of the gate electrode to which the ON voltage is applied, the channel being a channel of the first select transistor to be turned OFF and the channel being connected with the gate electrode to which the ON voltage is applied,
and wherein the voltage application circuit applies the OFF voltage to the gate electrode connected with the channel at another side of the gate electrode to which the second OFF voltage is applied, the channel being a channel of the first select transistor to be turned OFF and the channel being connected with the gate electrode to which the second OFF voltage is applied.

6. The semiconductor storage device according to claim 1, wherein the selector comprising:
a planar selection plate formed on a plane made by the first direction and the second direction; and
a plurality of second select transistors provided along the first direction corresponding to each of the memory cell arrays, the second select transistor disposed between the selection plate and the memory cell array, and the second select transistor extending in the second direction.

7. The semiconductor storage device according to claim 1, wherein the memory cell array includes a pair of memory cells opposing to each other along the second direction, and wherein the first select transistor is configured to select each of the pair of memory cells individually.

8. The semiconductor storage device according to claim 1, wherein the memory cell array includes a pair of memory cells opposing to each other along the second direction, wherein a gate electrode of the first select transistor is connected with, through a gate insulator film, each of channels of each of the first select transistors adjacent to each other in the second direction,
wherein the semiconductor storage device comprising:
a third select transistor that is disposed between the selector and the memory cell array and that individually selects the pair of memory cells; and
a voltage application circuit that applies an electric voltage to a gate electrode of the first select transistor,
wherein the voltage application circuit applies a predetermined ON voltage that turns ON the first select transistor to the gate electrode connected with a channel of the first select transistor to be turned ON,
wherein the voltage application circuit applies a second OFF voltage smaller than a predetermined OFF voltage that turns OFF the first select transistor to the gate electrode connected with the channel at another side of the gate electrode to which the ON voltage is applied, the channel being a channel of the first select transistor to be turned OFF and the channel being connected with the gate electrode to which the ON voltage is applied,
and wherein the voltage application circuit applies the OFF voltage to the gate electrode connected with the channel at another side of the gate electrode to which the second OFF voltage is applied, the channel being a channel of the first select transistor to be turned OFF and the channel being connected with the gate electrode to which the second OFF voltage is applied.

9. The semiconductor storage device according to claim 1, wherein the selector is configured as a planar selection plate formed in a plane made by the first direction and the second direction,
wherein the memory cell array includes a pair of memory cells opposing to each other along the second direction,
wherein a gate electrode of the first select transistor is connected with, through a gate insulator film, each of channels of each of the first select transistors adjacent to each other in the second direction,
and wherein the semiconductor storage device comprising:
a fourth select transistor that is disposed between the selector and the memory cell array, that is extended in the second direction, and that is connected with each of the memory cell arrays; and
a fifth select transistor that is disposed between the fourth select transistor and the memory cell array, and that individually selects the pair of memory cells.

10. The semiconductor storage device according to claim 1,
wherein the memory cell array includes a pair of memory cells opposing to each other along the second direction,
wherein the first select transistor is configured by:
a first gate electrode, that is connected with one of the pair of memory cells included in a first one of the memory cell array, and that is connected with one of the pair of memory cells included in second one of the memory cell array adjacent to the first one of the memory cell array; and
a second gate electrode that is connected with each of the pair of memory cells included in the memory cell array,
the first gate electrode and the second gate electrode being paired and being connected with each other through an insulator film,
wherein the semiconductor storage device comprising a voltage application circuit that applies an electric voltage to the first gate electrode and to the second gate electrode, wherein the voltage application circuit applies a predetermined ON voltage that turns ON the first select transistor to the first and second gate electrodes connected with the memory cell to be selected, wherein the voltage application circuit applies a second OFF voltage smaller than a predetermined OFF voltage that turns OFF the first select transistor, to the second gate electrode that is connected with the memory cell to be not selected and that is adjacent to the first gate electrode to which the ON voltage is applied, and to the first gate electrode that is connected with the memory cell to be not selected and that is adjacent to the second gate electrode to which the ON voltage is applied, and wherein the voltage application circuit applies the OFF voltage, to the second gate electrode that is connected with the memory cell to be not selected and that is not adjacent to the first gate electrode to which the ON voltage is applied, and to the first gate electrode that is connected with the memory cell to be not selected and that is not adjacent to the second gate electrode to which the ON voltage is applied.

11. The semiconductor storage device according to claim 1, wherein the semiconductor storage device is formed by stacking a plurality of stacked bodies, the stacked body comprising:

the first select transistor;

the selector; and the memory cell array, and wherein the stacked body further comprising a layer select transistor that is disposed between the first select transistor and the lower electrode and that selects the stacked body.

12. The semiconductor storage device according to claim 11, wherein at least one of a gate electrode of the first select transistor, the selector, the lower electrode, and a cell gate electrode of the memory cell in the memory cell array included in the stacked body is configured to be at a same electric voltage as that of corresponding portion included in another one of the stacked body, and wherein a gate electrode of the layer select transistor is electrically independent between each of the stacked bodies.

13. The semiconductor storage device according to claim 1, wherein the memory cell is a resistance random access memory.

* * * * *